United States Patent [19]
Yusa et al.

[11] Patent Number: 5,633,806
[45] Date of Patent: May 27, 1997

[54] SEMICONDUCTOR INTEGRATED CIRCUIT AND METHOD OF DESIGNING SAME

[75] Inventors: Terukazu Yusa; Kazuhiro Sakashita; Isao Takimoto; Takeshi Hashizume; Tatsunori Komoike, all of Itami, Japan

[73] Assignee: Mitsubishi Denki Kabushiki Kaisha, Tokyo, Japan

[21] Appl. No.: 493,299

[22] Filed: Jun. 21, 1995

Related U.S. Application Data

[63] Continuation of Ser. No. 80,789, Jun. 24, 1993, abandoned.

[30] Foreign Application Priority Data

Oct. 12, 1992 [JP] Japan .................................. 4-272827

[51] Int. Cl.$^6$ ........................................ G06F 17/50
[52] U.S. Cl. ................... 364/490; 364/488; 364/491
[58] Field of Search ........................ 364/488, 489, 364/490, 491; 340/825.83, 825.85, 825.86, 825.87; 326/37, 38, 39, 41, 47, 101

[56] References Cited

U.S. PATENT DOCUMENTS

| | | | |
|---|---|---|---|
| Re. 34,363 | 8/1993 | Freeman | 307/465 |
| 4,600,995 | 7/1986 | Kinoshita | 364/491 |
| 4,631,686 | 12/1986 | Ikawa et al. | 364/490 |
| 4,701,810 | 10/1987 | Mader | 364/490 |
| 4,706,216 | 11/1987 | Carter . | |
| 4,727,268 | 2/1988 | Hori | 307/465 |
| 4,727,493 | 2/1988 | Taylor, Sr. | 364/490 |
| 4,786,904 | 11/1988 | Graham, III et al. | 340/825.83 |
| 4,870,302 | 9/1989 | Freeman | 307/465 |
| 4,871,930 | 10/1989 | Wong et al. | 307/465 |
| 4,903,223 | 2/1990 | Norman et al. | 364/716 |
| 4,922,441 | 5/1990 | Tsukagoshi et al. | 364/491 |
| 4,931,671 | 6/1990 | Agrawal | 307/465 |
| 4,933,576 | 6/1990 | Tamamura et al. | 307/465 |
| 4,940,909 | 7/1990 | Mulder et al. | 307/465 |
| 4,949,275 | 8/1990 | Nonaka | 364/490 |
| 5,051,917 | 9/1991 | Gould et al. | 364/489 |
| 5,089,973 | 2/1992 | Furtek | 364/489 |
| 5,155,390 | 10/1992 | Hickman et al. | 307/465.1 |
| 5,233,539 | 8/1993 | Agrawal et al. | 364/489 |
| 5,253,181 | 10/1993 | Marui et al. | 364/489 |
| 5,283,753 | 2/1994 | Schucker et al. | 364/490 |
| 5,317,698 | 5/1994 | Chan | 395/325 |
| 5,369,595 | 11/1994 | Gould et al. | 364/490 |
| 5,386,154 | 1/1995 | Goetting et al. | 326/44 |
| 5,402,358 | 3/1995 | Smith et al. | 364/490 |
| 5,448,493 | 9/1995 | Topolewski et al. | 364/489 |
| 5,469,368 | 11/1995 | Agrawal et al. | 364/489 |
| 5,499,192 | 3/1996 | Knapp et al. | 364/489 |

OTHER PUBLICATIONS

Smith et al., "Cell Libraries & Assembly Tools for AID CMOS & BiCMOS ASIC Design," IEEE Journal of Solid-State Circuits, vol. 24, No. 5, Oct. 1989, pp. 1419–1432.

*Primary Examiner*—Kevin J. Teska
*Assistant Examiner*—Leigh Marie Garbowski
*Attorney, Agent, or Firm*—Oblon, Spivak, McClelland, Maier & Neustadt, P.C.

[57] ABSTRACT

Programmable logical blocks (3a to 3c) selected from a block library including information of a plurality of types of programmable logical blocks are disposed in a core region of a semiconductor integrated circuit (100). The degree of freedom of designing a field programmable gate array (FPGA) and the degree of integration are increased. A logic LSI is permitted to have redundancy to flexibly cope with design changes. This affords reduction in develop period and develop costs.

31 Claims, 25 Drawing Sheets

S1=S2=S3=S4=S5=S6=S7="0"

S1=S2=S3=S4=S5=S6="0"   S7="1"

S1=S2=S3=S4=S7= "0"   S5=S6= "1"

| y | LOGICAL FUNCTION SELECTED IN PROGRAMMABLE LOGICAL BLOCK 310 | LOGICAL FUNCTION SELECTED IN PROGRAMMABLE LOGICAL BLOCK 311 |
|---|---|---|
| 0 |  |  |
| 1 |  |  |

| x | y |
|---|---|
| 0 | p |
| 1 | 0 |

| x | y |
|---|---|
| 0 | p |
| 1 | 0 |

SEMICONDUCTOR INTEGRATED CIRCUIT AND METHOD OF DESIGNING SAME

This application is a continuation of application Ser. No. 08/080,789, filed on Jun. 24, 1993, now abandoned.

BACKGROUND OF THE INVENTION

1. Field of the Invention

The present invention relates to a semiconductor integrated circuit including programmable logical blocks.

2. Description of the Background Art

Recently electronic circuit devices have progressed rapidly, and a tendency to develop high-performance and high-function devices for short periods of time has accelerated. A need exists for integrated circuit devices which are a key to the short-term development of electronic circuit devices having high performance and function. Based on such background, a semiconductor integrated circuit has been put to practical use which is known as a field programmable gate array (hereinafter referred to as an "FPGA") capable of achieving various functions by means of programs.

FIG. 31 is an arrangement diagram of the an exemplary FPGA of prior art. A semiconductor integrated circuit 1 comprises: I/O buffers 2 around the periphery of the chip; programmable logical blocks 300 in a core region surrounded by the I/O buffers 2; wires 4 for interconnecting the I/O buffers 2 and the programmable logical blocks 300; and switch matrices 5 for controlling the connection of the wires 4.

In the programmable logical blocks 300, a plurality of limited logical functions are arranged, and one of the logical functions is selectively achieved by a control signal applied from the exterior of the semiconductor integrated circuit 1. The switch matrices 5 are controlled by a program applied from the exterior of the semiconductor integrated circuit 1, whereby desired functions of the whole semiconductor integrated circuit 1 are provided.

With the semiconductor integrated circuit 1 that is the conventional FPGA constructed as described above, its achievable functions are restricted by the logical functions arranged in the programmable logical blocks 300 and by the wires connectable with the switch matrices 5. On the other hand, the logical functions arranged in the programmable logical block 300 are previously limited when fabricated. An attempt to reduce the restrictions on the functions achievable in the semiconductor integrated circuit 1 causes a large number of redundant portions included in the programmable logical blocks 300. Such redundancy is generated also in the wires 4 and switch matrices 5, resulting in substantial reduction in the degree of integration of the semiconductor integrated circuit 1.

SUMMARY OF THE INVENTION

The present invention is directed to a method of designing a semiconductor integrated circuit. According to the present invention, the method comprises the steps of: (a) providing a macro cell library including a plurality of predetermined logical functions in the form of information of macro cells; (b) forming a programmable logical block using at least one of the macro cells selected from the macro cell library; (c) disposing the programmable logical block in a predetermined position of the semiconductor integrated circuit; and (d) repeating the steps (b) and (c) a predetermined number of times, wherein a plurality of logical functions are arranged in the programmable logical block, and the programmable logical block receives a control signal to select one of the logical functions.

In the method, the specification of the programmable logical blocks may be changed in the slice process.

The present method copes with the specification changes which are not done only by program changes, by changing only the slice process in the same manner as the gate array to change the specification of the programmable logical blocks themselves, reducing develop costs.

In another aspect of the present invention, a method of designing a semiconductor integrated circuit, comprises the steps of: (a) selecting one programmable logical block from a block library including a plurality of types of programmable logical blocks; (b) disposing the one programmable logical block in a predetermined position of the semiconductor integrated circuit; and (c) repeating the steps (a) and (b) a predetermined number of times, wherein a plurality of logical functions are arranged in the programmable logical blocks, and the programmable logical blocks receive a control signal to select one of the logical functions.

In the method, an appropriate number of programmable logical blocks of appropriate types are selected from the block library to be disposed in accordance with a desired specification.

The programmable logical blocks, having different functions included in the block library as repertoires, are selected therefrom to be disposed and wired in accordance with a desired circuit. This provides for an increased degree of freedom of design as compared with the conventional FPGA in which the programmable logical blocks and wires are previously disposed. In addition, reduction in redundancy of the circuit is effective to increase the degree of integration.

Preferably, the programmable logical blocks include input and output pins, and the programmable logical blocks in the block library are classified in accordance with the number of the input and output pins.

The programmable logical blocks are mechanically classified in the block library.

The library having a small number of repertories is formed.

Preferably, the programmable logical blocks include input and output pins, and the programmable logical blocks in the block library are classified in accordance with the number of the input and output pins and the logical functions arranged in the programmable logical blocks.

The block library includes less redundant programmable logical blocks as repertories.

The library having the less redundant programmable logical blocks as repertoires is formed, so that the degree of integration is increased.

Preferably, the plurality of logical functions arranged in the programmable logical blocks are classified into one main function and at least one subfunction, and the programmable logical blocks in the block library are classified in accordance with the main function thereof.

The logical functions arranged in the programmable logical blocks in the block library are represented by the main function thereof.

The programmable logical blocks are made to serve as repertoires in accordance with the main function, permitting a designer to proceed with the design without the consideration of the program, in the same fashion as the normal gate array.

Preferably, the main function is selected by the single control signal.

The main function of the programmable logical blocks may be selected with ease.

Ease of program changes enables the develop costs to be reduced.

Preferably, the programmable logical blocks include a function selecting portion including a reset terminal receiving the single control signal and a program storage element for storing information for selecting the logical functions arranged in the programmable logical blocks, and the main function is selected independently of the information stored in the program storage element where the single control signal has a predetermined logical value.

The main function of the programmable logical blocks is selected by the control signal independently of the information for selecting the logical functions stored in the program storage element.

A program change is completed only by changing the data of the program storage element of the programmable logical blocks to be changed. This is effective to reduce the develop costs.

Preferably, the reset terminal resets the program storage element.

The program change is completed only by changing the data of the program storage element of the programmable logical blocks to be changed. This is effective to reduce the develop costs.

Preferably, the function selecting portion further includes an AND gate for providing a logical product of the information stored in the program storage element and the single control signal, and the selection of the logical functions arranged in the programmable logical blocks is made depending on the output of the AND gate.

The AND gate is responsive to the single control signal for determining whether or not to apply the output of the program storage element to the programmable logical blocks.

The program change is completed only by changing the data of the program storage element of the programmable logical blocks to be changed. This is effective to reduce the develop costs.

The program may be changed during the execution of the main function of the programmable logical blocks.

The present invention is also directed to a semiconductor integrated circuit. According to the present invention, the semiconductor integrated circuit comprises: a core region; and at least one programmable logical block formed in the core region and selected from a library having a plurality of types of programmable logical blocks, wherein a plurality of logical functions are arranged in the programmable logical blocks, and the programmable logical blocks receive a control signal to select one of the logical functions.

The programmable logical blocks of appropriate types in appropriate number are selected from the block library to be disposed in accordance with a desired specification.

The semiconductor integrated circuit of the present invention has an increased degree of freedom of design as compared with the conventional FPGA in which the programmable logical blocks and the wires are previously disposed. In addition, reduction in redundancy of the circuit is effective to increase the degree of integration.

Preferably, the semiconductor integrated circuit further comprises a gate array region in the core region.

The degree of freedom of designing the gate array increases the degree of freedom of circuit design.

The degree of freedom of circuit design is increased as compared with a circuit wherein the desired functions are achieved only by the programmable logical blocks. This reduces the redundant circuit and increases the degree of integration.

Preferably, the semiconductor integrated circuit further comprises a fixed function circuit having a fixed function in the core region.

The function of the fixed function circuit block is not changed.

The degree of freedom of circuit design is increased, whereby the redundant circuit is reduced and the degree of integration is increased.

Preferably, the semiconductor integrated circuit further comprises a gate array region in the core region.

The fixed function circuit block and the gate array control the program of the programmable logical blocks.

The program control block for controlling the program of the programmable logical blocks is highly integrated.

Preferably, the programmable logical blocks are formed in the gate array region.

The specification of the programmable logical blocks may be changed in the slice process.

The degree of freedom of circuit design is increased, whereby the redundant circuit is reduced and the degree of integration is increased. The present invention may cope with a change of the specification which is not done by the program change by changing the slice process in the same fashion as the gate array, thereby reducing the develop costs.

An object of the present invention is to increase the degree of freedom of designing an FPGA without increasing complexity of design to increase the substantial degree of integration.

These and other objects, features, aspects and advantages of the present invention will become more apparent from the following detailed description of the present invention when taken in conjunction with the accompanying drawings.

DESCRIPTION OF THE PREFERRED EMBODIMENTS (1) First Preferred Embodiment

Figure 1:
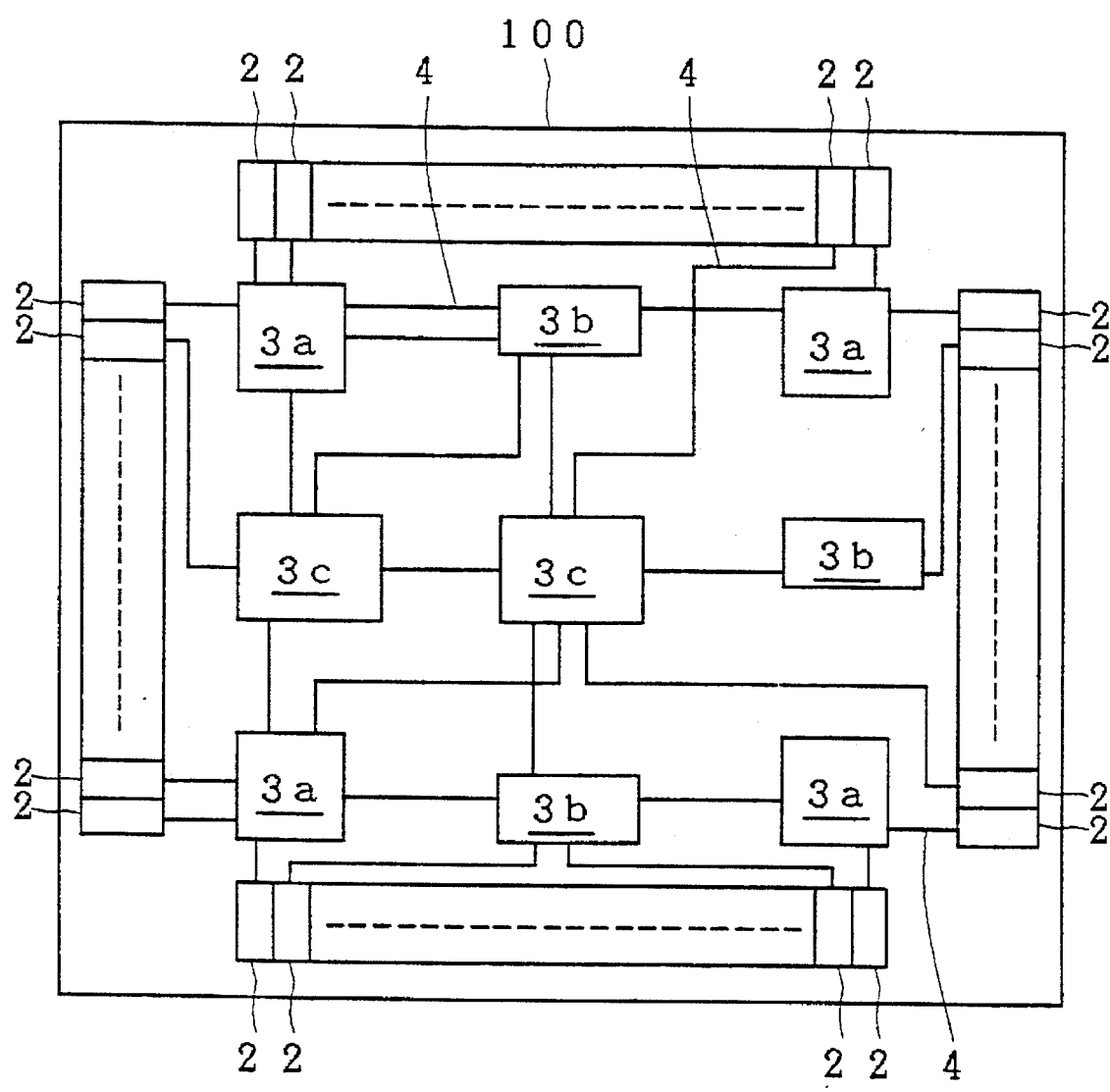
FIG. 1 is an arrangement diagram of a semiconductor integrated circuit of a first preferred embodiment according to the present invention.
Figure 31:
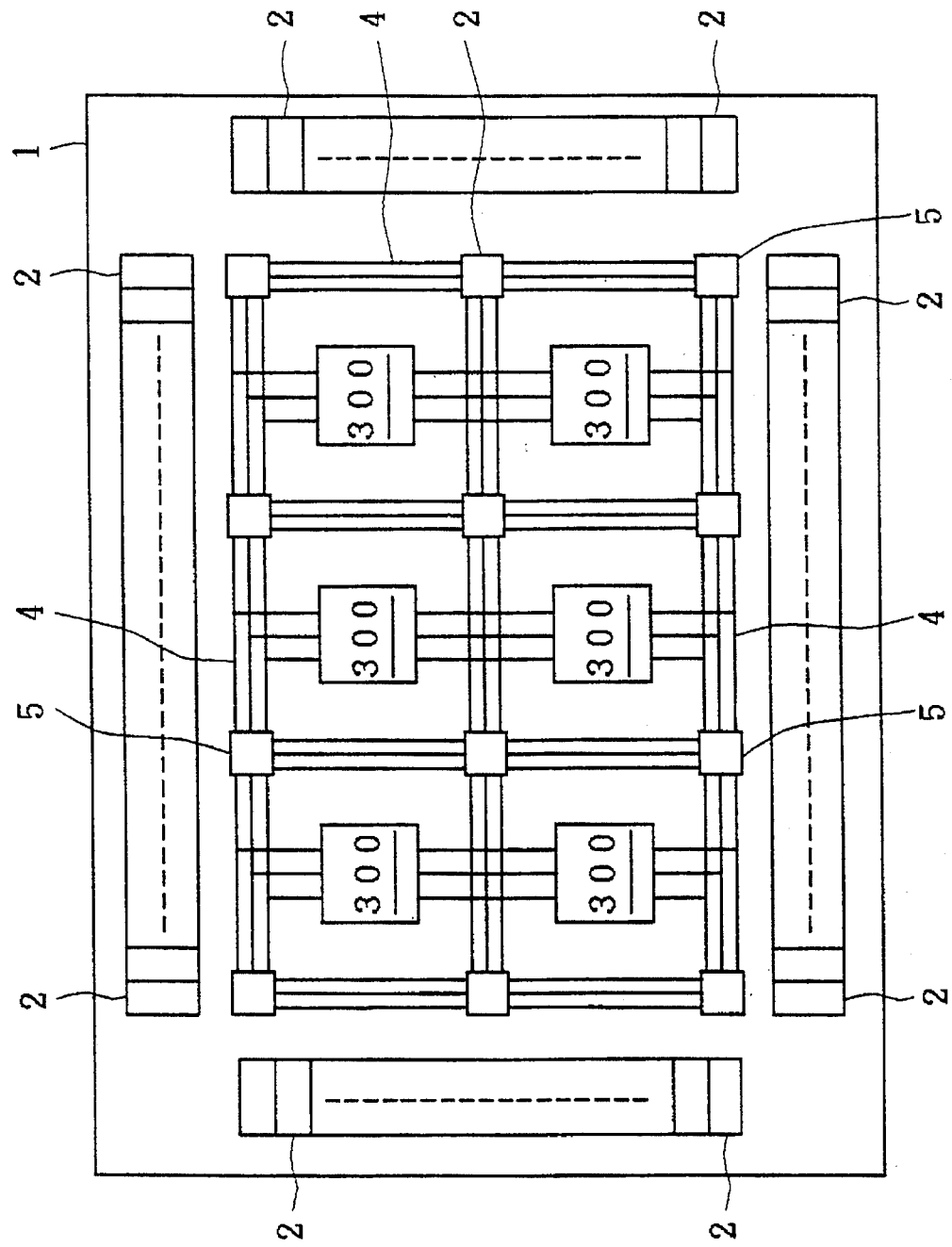
FIG. 31 is an arrangement diagram of the prior art.

FIG. 1 is an arrangement diagram of a semiconductor integrated circuit 100 of a first preferred embodiment according to the present invention. The semiconductor integrated circuit 100 comprises I/O buffers 2 disposed around the periphery in the same manner as the conventional FPGA of FIG. 31. In a core region surrounded by the I/O buffers 2, however, programmable logical blocks 3a to 3c are disposed in place of the programmable logical blocks 300. A switch matrix 5 is absent, and wires 4 connect the programmable logical blocks 3a to 3c and the I/O buffers 2 in accordance with specifications.

A plurality of logical functions to be selected by a control signal are arranged in each of the programmable logical blocks 3a to 3c. The programmable logical blocks 3a to 3c have different sets of arranged logical functions.

The programmable logical blocks 3a to 3c are provided in a block library when the semiconductor integrated circuit 100 is designed. In designing the prior art semiconductor integrated circuit 1, the programmable logical blocks 300 are of one type and are not arranged in the form of a library. In the present invention, however, the programmable logical blocks to be arranged are of several types. In designing the semiconductor integrated circuit 100, the programmable logical blocks are selected from the block library to be disposed in accordance with the specifications.

This affords, in addition to the degree of freedom of the programmable logical blocks themselves for selecting one of the logical functions by the control signal, the degree of freedom for selecting one of the programmable logical blocks. There is no need for one programmable logical block to have a large number of logical functions to meet various specifications, so that less redundant circuit design is accomplished. This is also effective to prevent the degree of integration from decreasing.

A method of designing the block library will be described later in connection with a method of designing the semiconductor integrated circuit according to the present invention.

(2) Second Preferred Embodiment

Figure 2:
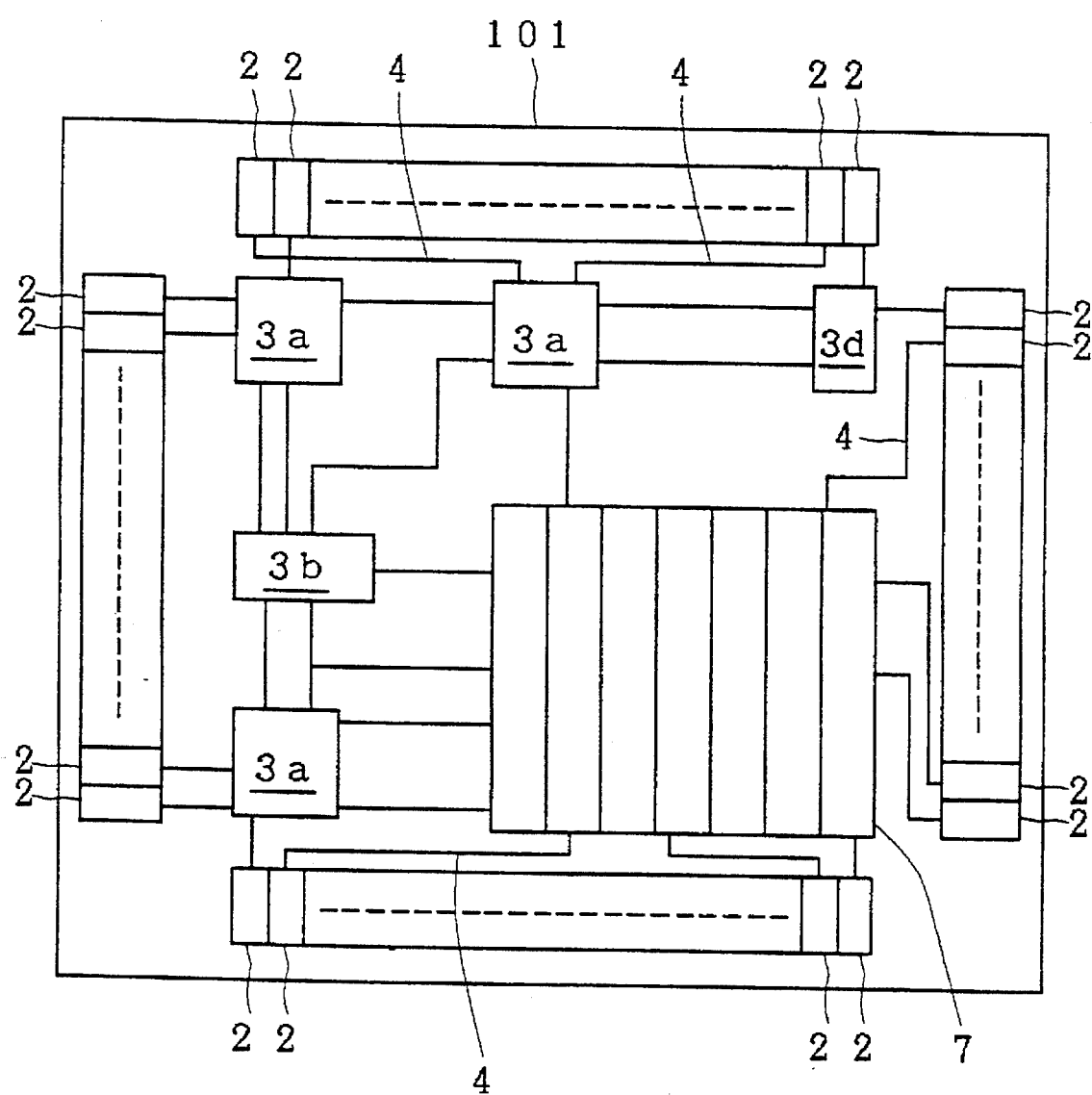
FIG. 2 is an arrangement diagram of the semiconductor integrated circuit of a second preferred embodiment according to the present invention.

FIG. 2 is an arrangement diagram of a semiconductor integrated circuit 101 of a second preferred embodiment according to the present invention. Referring to FIG. 2, the semiconductor integrated circuit 101 comprises a fixed function circuit block 7 as well as programmable logical blocks 3a to 3d. Unlike the programmable logical blocks 3a to 3d, the fixed function circuit block 7 has no scope for selection of the functions thereof, such as RAMs and ROMs.

In the core region, all logic circuits are not formed by means of the programmable logical blocks. The logic circuits on which required functions have been determined need not be formed using the programmable logical blocks. Such logic circuits are designed to have initially determined functions to prevent the design redundancy resulting from the programmable logical blocks.

Thus the degree of freedom of designing the semiconductor integrated circuit is increased so that the reduction in the degree of integration is prevented.

(3) Design Technique for First and Second Preferred Embodiments

Figure 3:
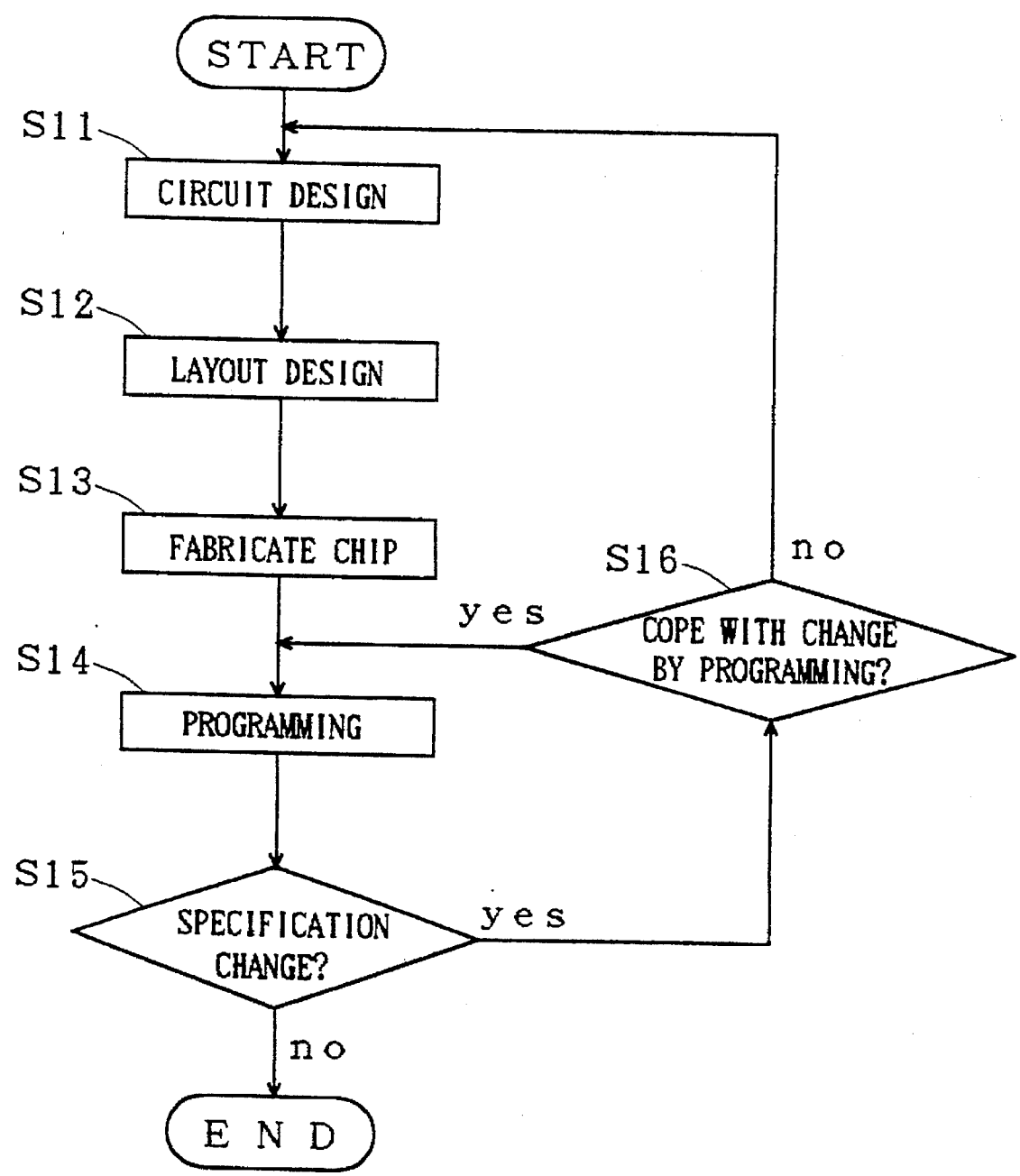
FIG. 3 is a flow chart showing a method of designing the semiconductor integrated circuit of the first and second preferred embodiments according to the present invention.

FIG. 3 is a flow chart showing a design technique for the first and second preferred embodiments. A logic circuit required in the semiconductor integrated circuit is designed in the step S11. In this step, data of an appropriate programmable logical block is selected from the block library, and then the required logic circuit is designed.

A layout design is made in the step S12, and a chip is fabricated based on the layout (step S13). A selection is made by programming which one of the logical functions arranged in the programmable logical block is to be actuated (step S14).

Subsequently, a user might change the specification, for example. In such case, a determination is made in the step S16 through the step S15. In the step S16 it is determined whether or not it is enabled to cope with a change of the logic circuit due to the specification change only by changing the logical functions to be achieved by the programmable logical block. When it is enabled, the process returns to the step S14 to execute a programming again.

When only the programming of the programmable logical block is not sufficient to cope with the change, the process returns to the step S11 to select the data of the appropriate programmable logical block again from the block library.

The semiconductor integrated circuit as stated in the first and second preferred embodiments that is designed in the foregoing manner has two ways to meet the specification change and has a large degree of freedom when fabricated.

(4) Third Preferred Embodiment

Figure 4:
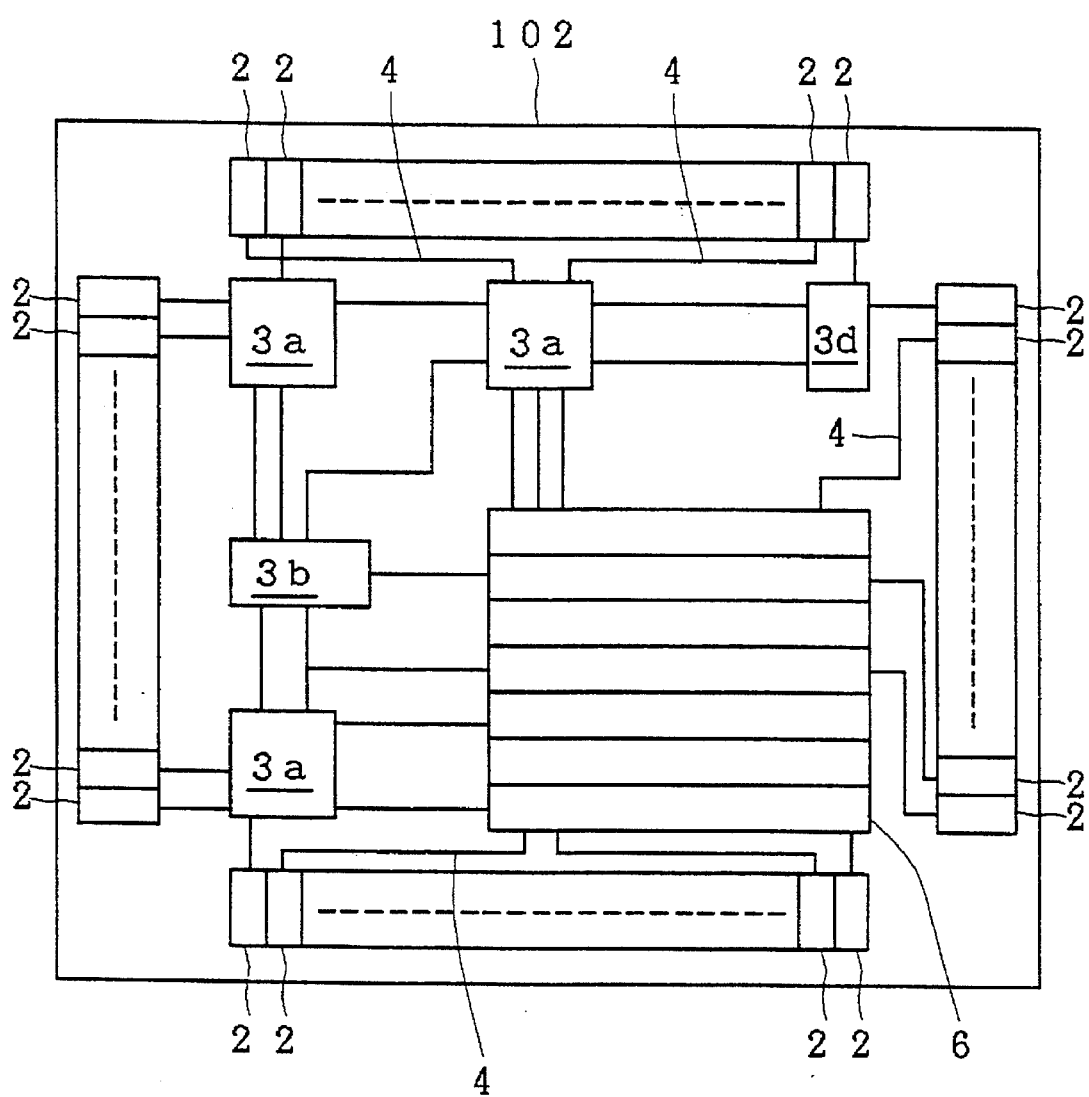
FIG. 4 is an arrangement diagram of the semiconductor integrated circuit of a third preferred embodiment according to the present invention.

FIG. 4 is an arrangement diagram of a semiconductor integrated circuit 102 of a third preferred embodiment according to the present invention. The semiconductor integrated circuit 102 comprises a gate array region 6 as well as the programmable logical blocks 3a to 3d. The functions of the gate array region 6 are changed by a slice process, unlike those of the programmable logical blocks 3a to 3d. Logic circuits which have functions generally determined and are not expected to undergo specification change sufficient to be coped with by the programmable logical blocks are formed in the gate array region 6. The gate array region 6 is formed for the logic circuits of low possibility of specification changes, whereby the degree of freedom of design is increased and the reduction in the degree of integration is prevented. The specification change which is not coped with by the program change may be done by changing only the slice process.

(5) Fourth Preferred Embodiment

Figure 5:
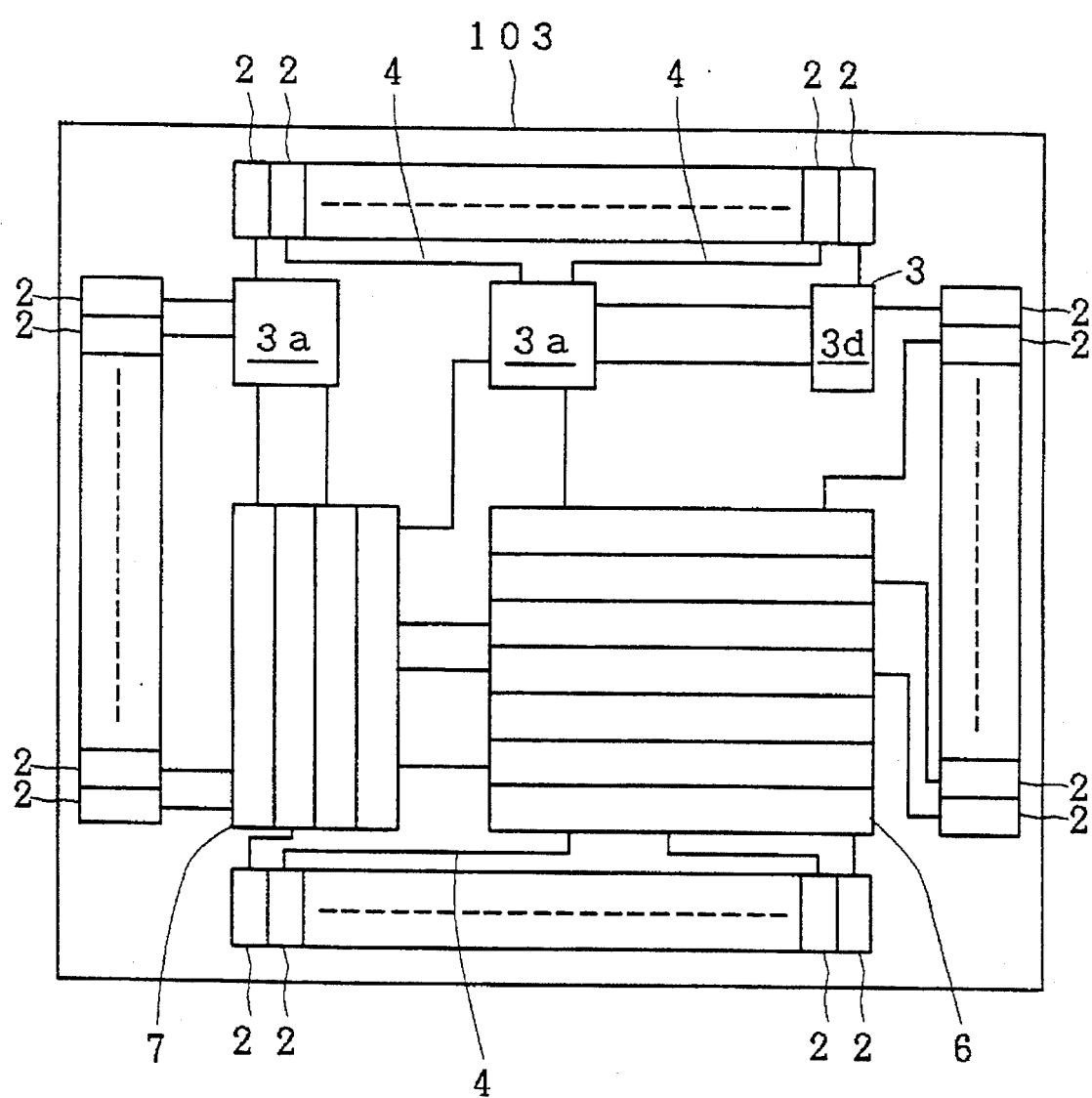
FIGS. 5 and 6 are arrangement diagrams of the semiconductor integrated circuit of a fourth preferred embodiment according to the present invention.

FIG. 5 is an arrangement diagram of a semiconductor integrated circuit 103 according to a fourth preferred embodiment of the present invention. Referring to FIG. 5, the semiconductor integrated circuit 103 comprises the gate array region 6 and the fixed function circuit block 7 as well as the programmable logical blocks 3a to 3d. Thus the semiconductor integrated circuit 103 has the same effects as the semiconductor integrated circuits 101 and 102 of the second and third preferred embodiments.

Figure 6:
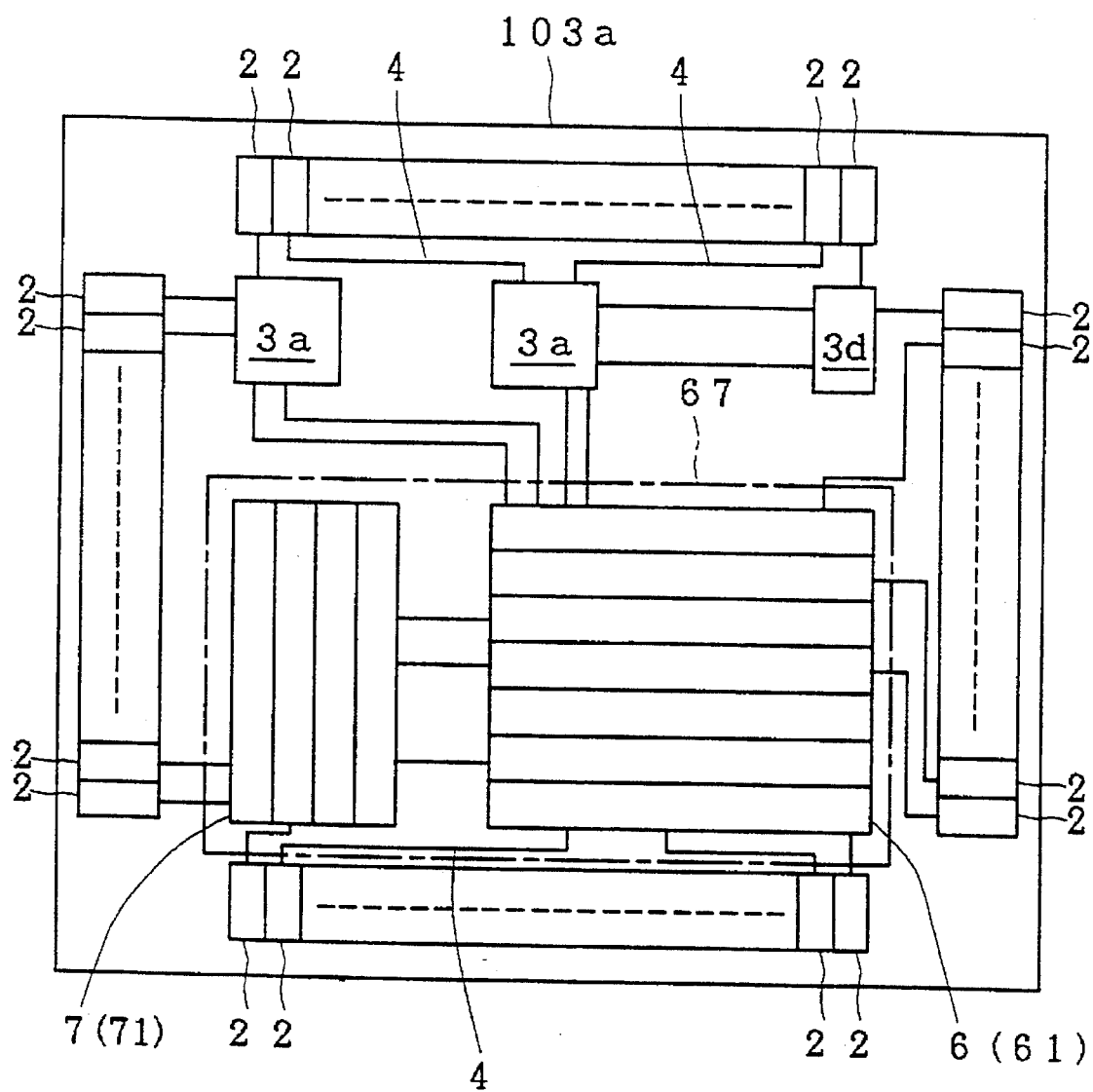

FIG. 6 is an arrangement diagram of a semiconductor integrated circuit 103a of another mode of the fourth preferred embodiment. A program control block 67 is formed with the gate array region 6 and the fixed function circuit block 7. The program control block 67 controls the program of the programmable logical blocks 3a and includes a holding block 71 for holding the program and a control signal producing block 61 for producing a control signal.

The holding block 71 preferably has a hard-macro structure such as RAMs, EPROMs in terms of large-scale circuitry and functions. The control signal producing block 61 might be required to be changed in accordance with the programmable logical blocks 3a. It is impractical for the control signal producing block 61 to have the hard-macro structure which requires much labor in designing.

The semiconductor integrated circuit 103a of FIG. 6 meets the requirements. The control signal producing block 61 is provided in the gate array region 6, and the holding block 71 is provided in the fixed function circuit block 7, so that the program control block 67 is highly integrated.

(6) Fifth Preferred Embodiment

Figure 7:
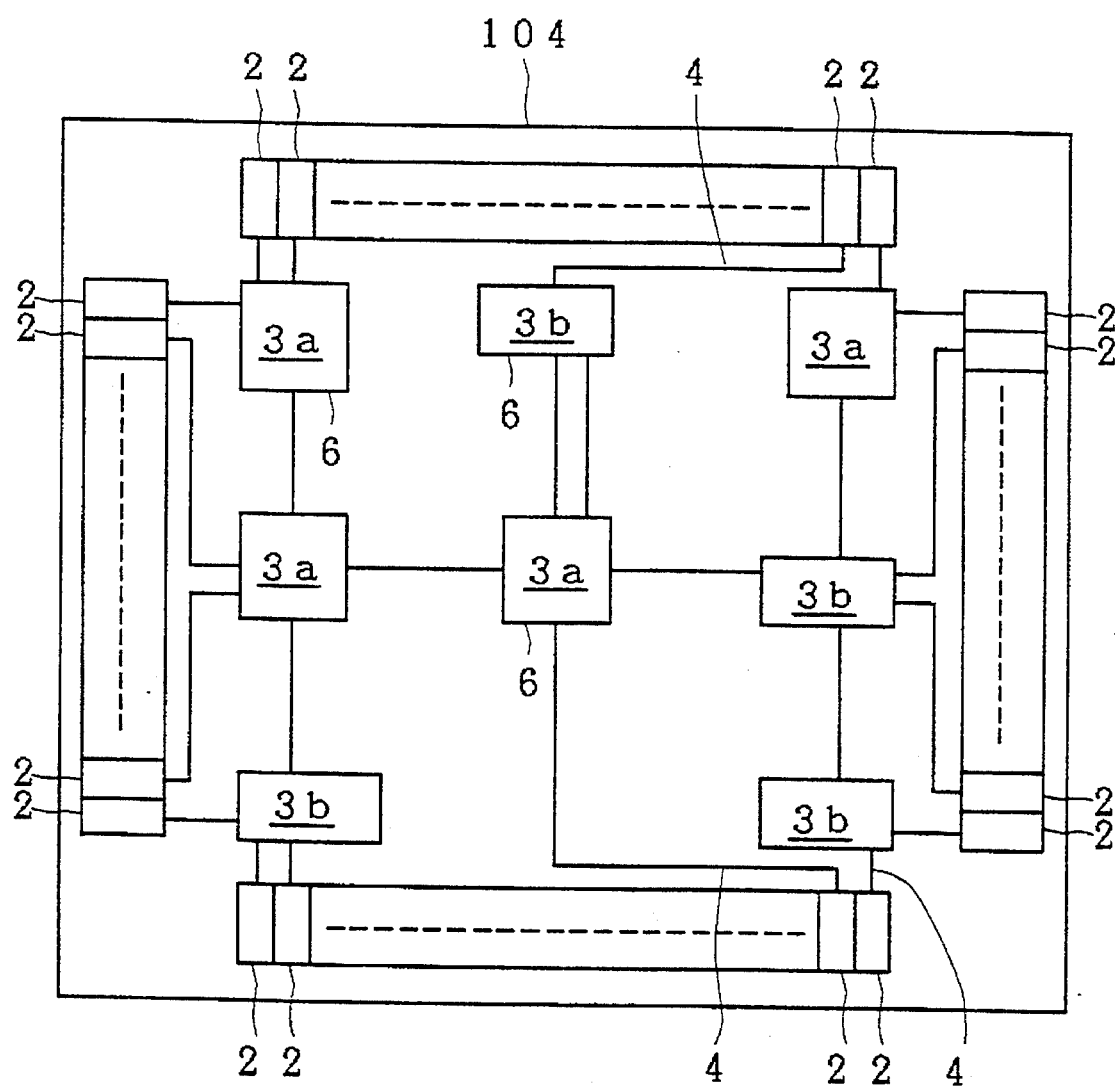
FIGS. 7 and 8 are arrangement diagrams of the semiconductor integrated circuit of a fifth preferred embodiment according to the present invention.

FIG. 7 is an arrangement diagram of a semiconductor integrated circuit 104 according to a fifth preferred embodiment of the present invention. The semiconductor integrated circuit 104 comprises the programmable logical blocks 3a and 3b. The position of the programmable logical blocks 3a and 3b coincides with the gate array region 6.

Figure 8:
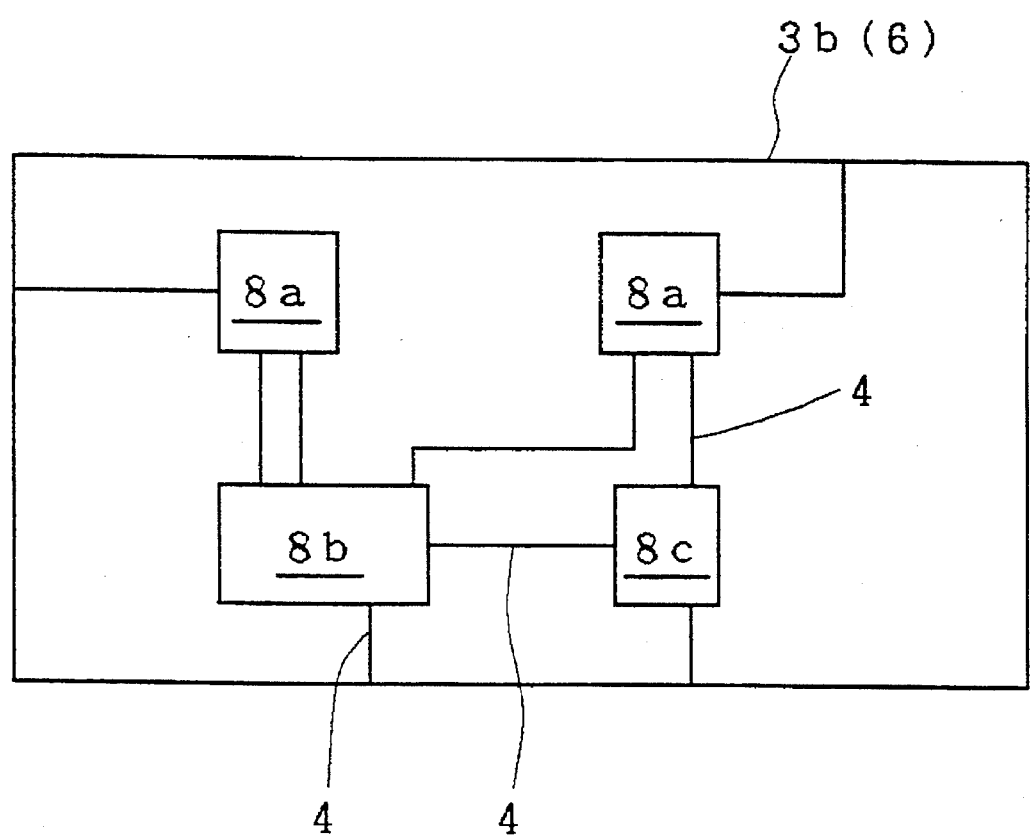

FIG. 8 shows a detailed internal structure of the programmable logical block 3b. The programmable logical block 3b includes gate array macro cells 8a to 8c and wires 4. The programmable logical block 3b is permitted to determine its internal structure in the gate array region 6 by the slice process in the same manner as a normal gate array. The same is true for other programmable logical blocks.

Thus the fifth preferred embodiment may cope with the specification change which is not done only by the program change by changing only the slice process in the same manner as a normal gate array to change the specification of the programmable logical blocks.

(7) Sixth Preferred Embodiment

Figure 9:
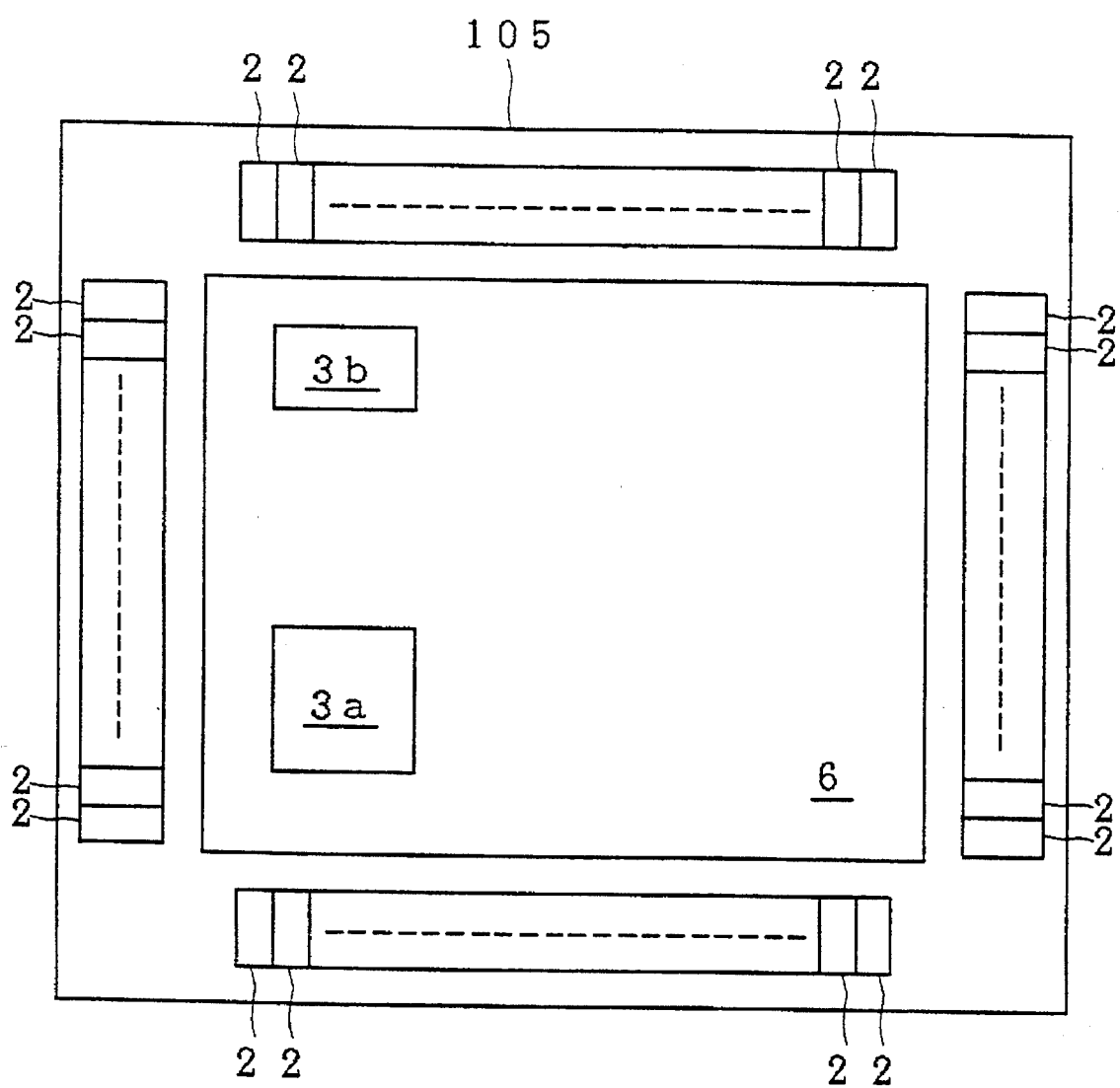
FIGS. 9 and 10 are arrangement diagrams of the semiconductor integrated circuit of a sixth preferred embodiment according to the present invention.

FIG. 9 is an arrangement diagram of a semiconductor integrated circuit 105 according to a sixth preferred embodiment of the present invention. The programmable logical blocks 3a and 3b are disposed in the gate array region 6.

Figure 10:
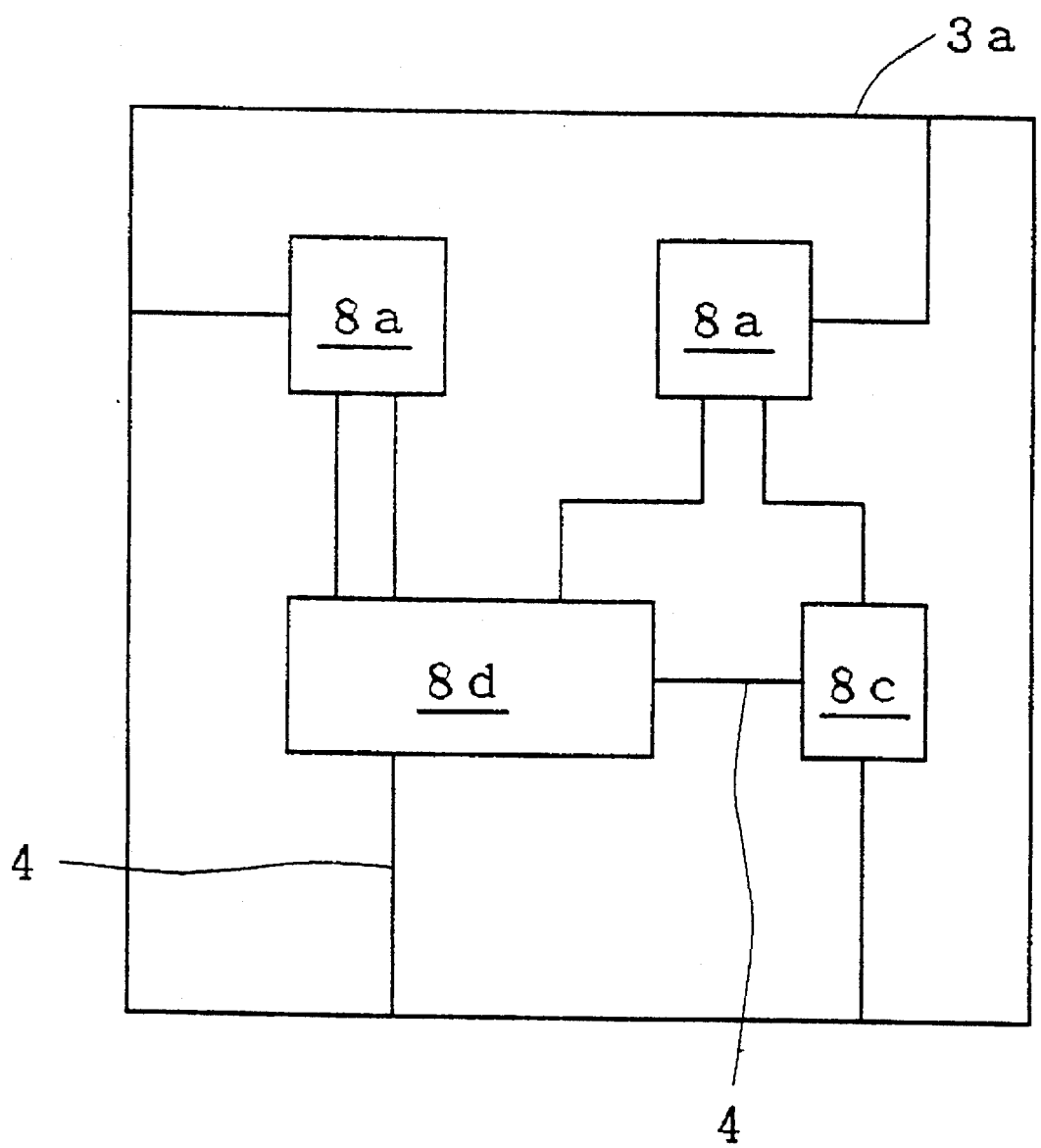

FIG. 10 shows a detailed internal structure of the programmable logical block 3a. The programmable logical block 3a includes gate array macro cells 8a to 8d and wires 4. The structure of the programmable logical block 3a is determined in the slice process similarly to a normal gate array. The same is true for the programmable logical block 3b.

Such arrangement of the semiconductor integrated circuit 105 enables the functions and the number of the programmable logical blocks to be determined in accordance with specifications. This increases the degree of freedom of designing the circuit, thereby reducing redundant circuits and increasing the degree of integration. Similarly to the fifth preferred embodiment, the sixth preferred embodiment may cope with the specification change which is not done only by the program change by changing only the slice process in the same fashion as the gate array to change the specification of the programmable logical blocks.

(8) Design Technique for Third to Sixth Preferred Embodiments

Figure 11:
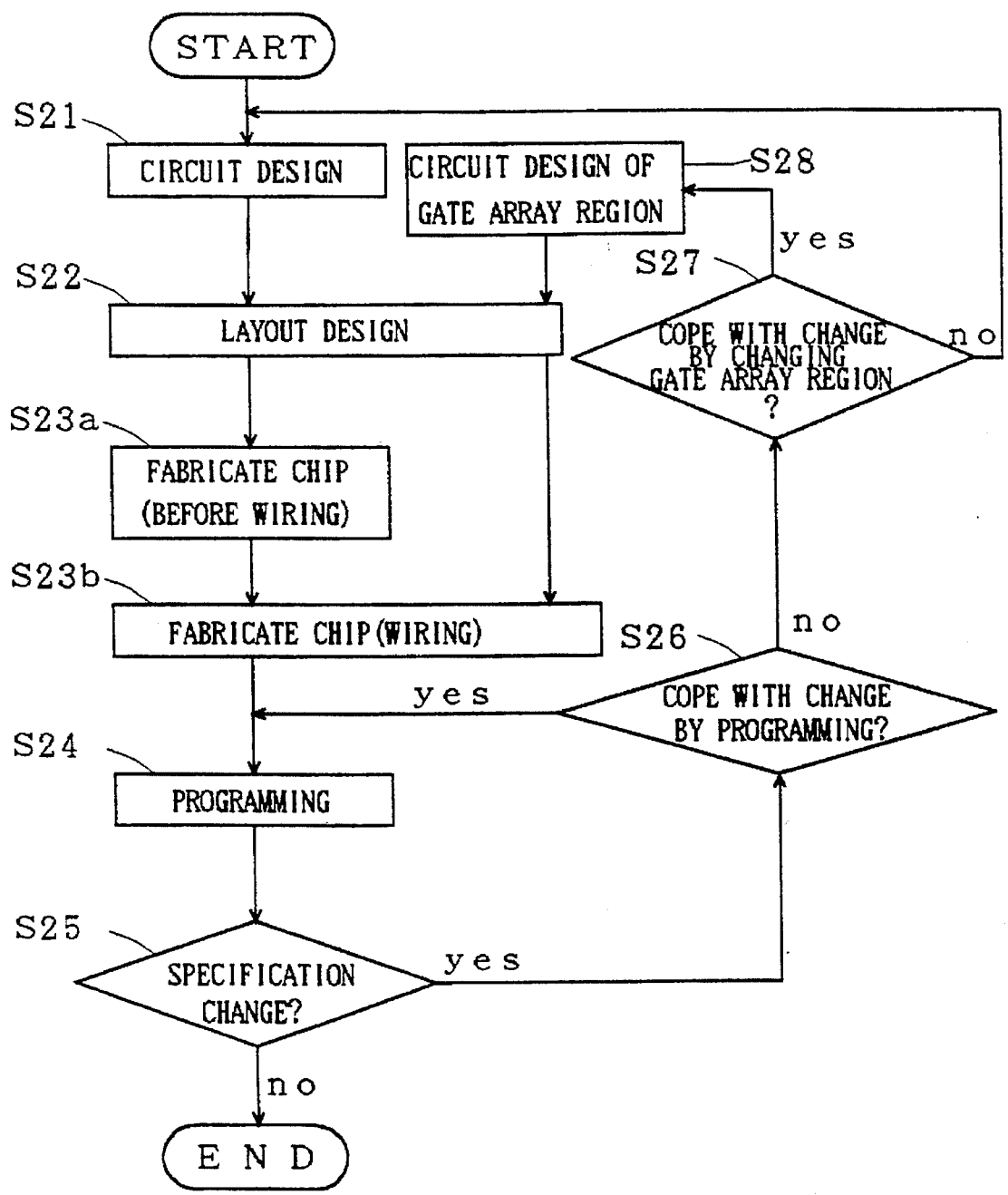
FIG. 11 is a flow chart showing the method of designing the semiconductor integrated circuit of the third to sixth preferred embodiments according to the present invention.

FIG. 11 is a flow chart showing a design technique for the third to sixth preferred embodiments. A logic circuit required in the semiconductor integrated circuit is designed in the step S21. This process step includes, in the third and fourth preferred embodiments, selecting data of an appropriate programmable logical block from the block library in the same manner as the step S11, and includes, in the fifth and sixth preferred embodiments, determining the connection of macro cells in the programmable logical block to be disposed in the gate array region.

A layout designed is made in the step S22, and a chip is fabricated based on the layout (steps S23a, S23b). The step S23a includes the process previous to the wiring process (slice process), and the step S23b includes the wiring process.

A selection is made by programming which one of the logical functions arranged in the programmable logical block is to be actuated in the same manner as in the step S14 (step S24).

Subsequently if a user changes the specification, a determination in the step S26 is made through the step S25. It is determined in the step S26 whether or not it is enabled to cope with a change of the logic circuit due to the specification change only by changing the logical functions to be achieved by the programmable logical block. If it is enabled, the process returns to the step S24 to execute a programming again.

When only the programming of the programmable logical block is not sufficient to cope with the specification change, a determination in the step S27 is made. It is determined in the step S27 if it is enabled to cope with the foregoing change only by changing the gate array region or changing the slice process, whether the programmable logical block may be formed in the gate array region or not.

If it is determined in the step S27 that it is enabled only by changing the slice process, the process proceeds to the step S28 to redesign the circuit of the gate array region. Then the layout design is made again (step S22), and the slice process is changed in the step S23b.

Furthermore, it is determined in the step S27 that it is not enabled to cope with the specification change only by changing the slice process, the process returns to the step S21 to redesign the circuit.

The semiconductor integrated circuit as stated in the third to sixth preferred embodiments that is designed in the foregoing manner has three ways to meet the specification change, if made, and accordingly has a large degree of freedom when fabricated.

(9) Seventh Preferred Embodiment

The block library used in the first and second preferred embodiments will be discussed hereinafter in seventh to ninth preferred embodiments.

Figure 12:
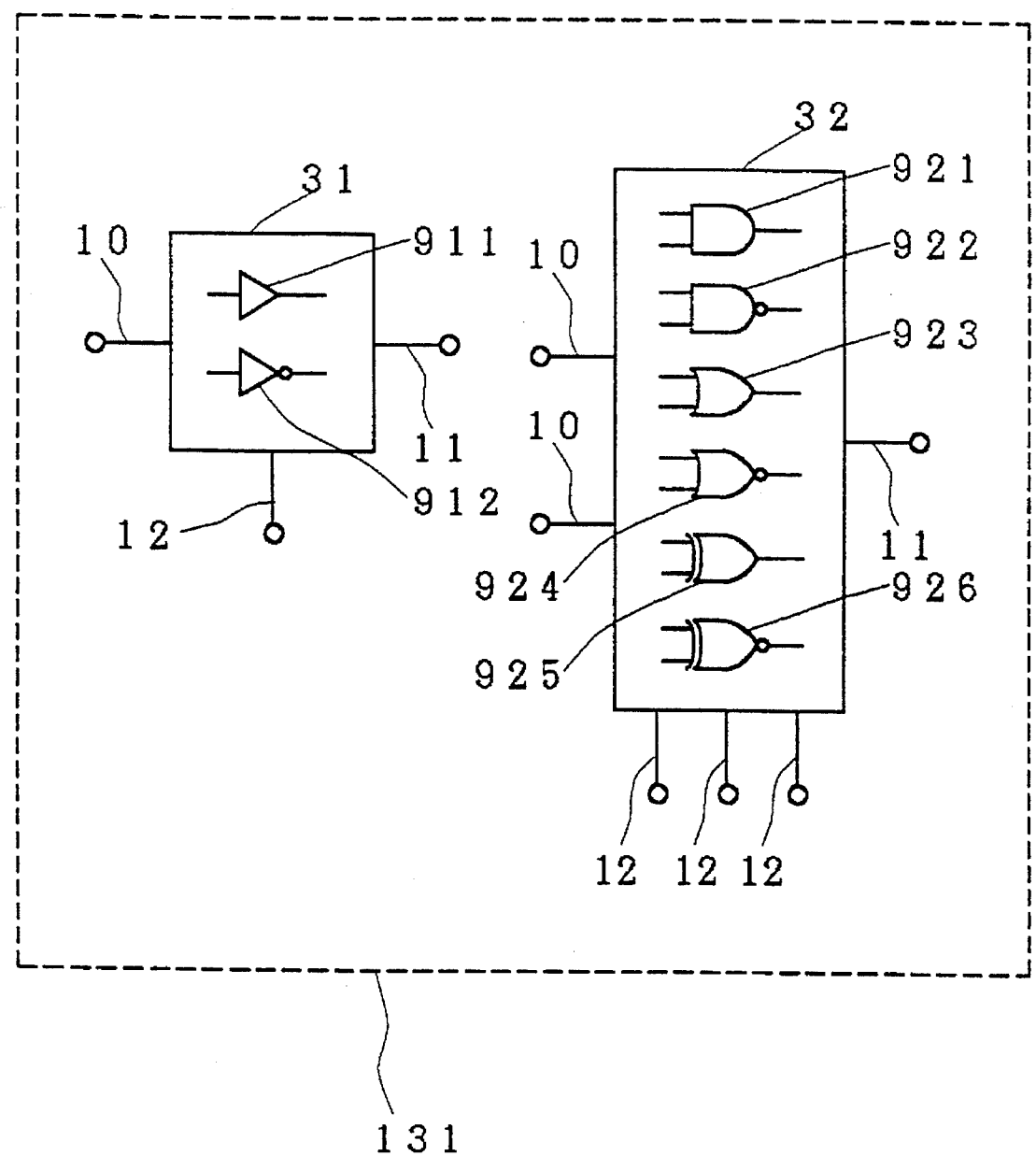
FIG. 12 is a conceptual illustration of a seventh preferred embodiment according to the present invention.

FIG. 12 is a conceptual illustration of a block library 131 for use in a method of designing a semiconductor integrated circuit according to the seventh preferred embodiment of the present invention. The block library 131 includes information of programmable logical blocks 31 and 32. The programmable logical blocks 31 and 32 have input pins 10, output pins 11, and function selection signal input pins 12.

The arranged logical functions are indicated by logic elements 911, 912 in the programmable logical block 31 and are indicated by logic elements 921 to 926 in the programmable logical block 32. For this reason, the number of respective pins of the block 31 is different from that of the block 32.

Classification of the programmable logical blocks 31, 32 in accordance with the number of input and output pins 10 and 11 enables mechanical classification thereof, to form the library of a small number of repertoires.

(10) Exemplary Design of Semiconductor Integrated Circuit Using Block Library

Now described in detail is the design of a desired semiconductor integrated circuit by means of the block library.

Figure 13:
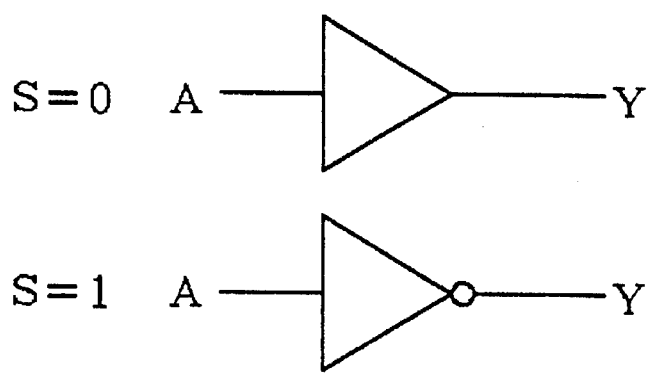
FIGS. 13 to 16 illustrate symbols of the seventh preferred embodiment according to the present invention.
Figure 14:
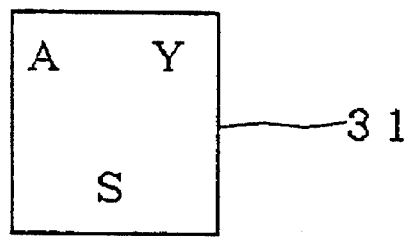
Figure 15:
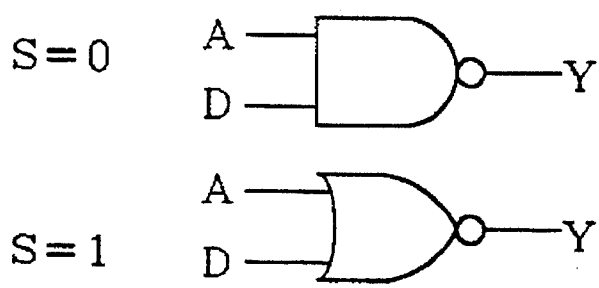
Figure 16:
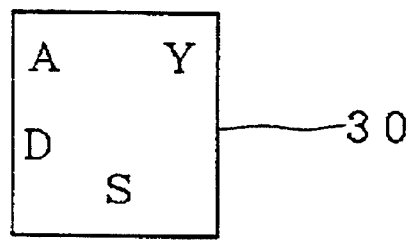

FIGS. 13 and 14 show the symbols of functions arranged in the programmable logical block 31 and the connecting terminals thereof, respectively. Likewise, FIGS. 15 and 16 show the symbols of functions arranged in a programmable logical block 30 and the connecting terminals thereof, respectively. Terminals Y and S correspond to the output pin 11 and the function selection signal input pin 12 of FIG. 12, respectively. A terminal A of the programmable logical block 31 and terminals A, D of the programmable logical block 30 correspond to the input pin 10 of FIG. 12.

Figure 17:
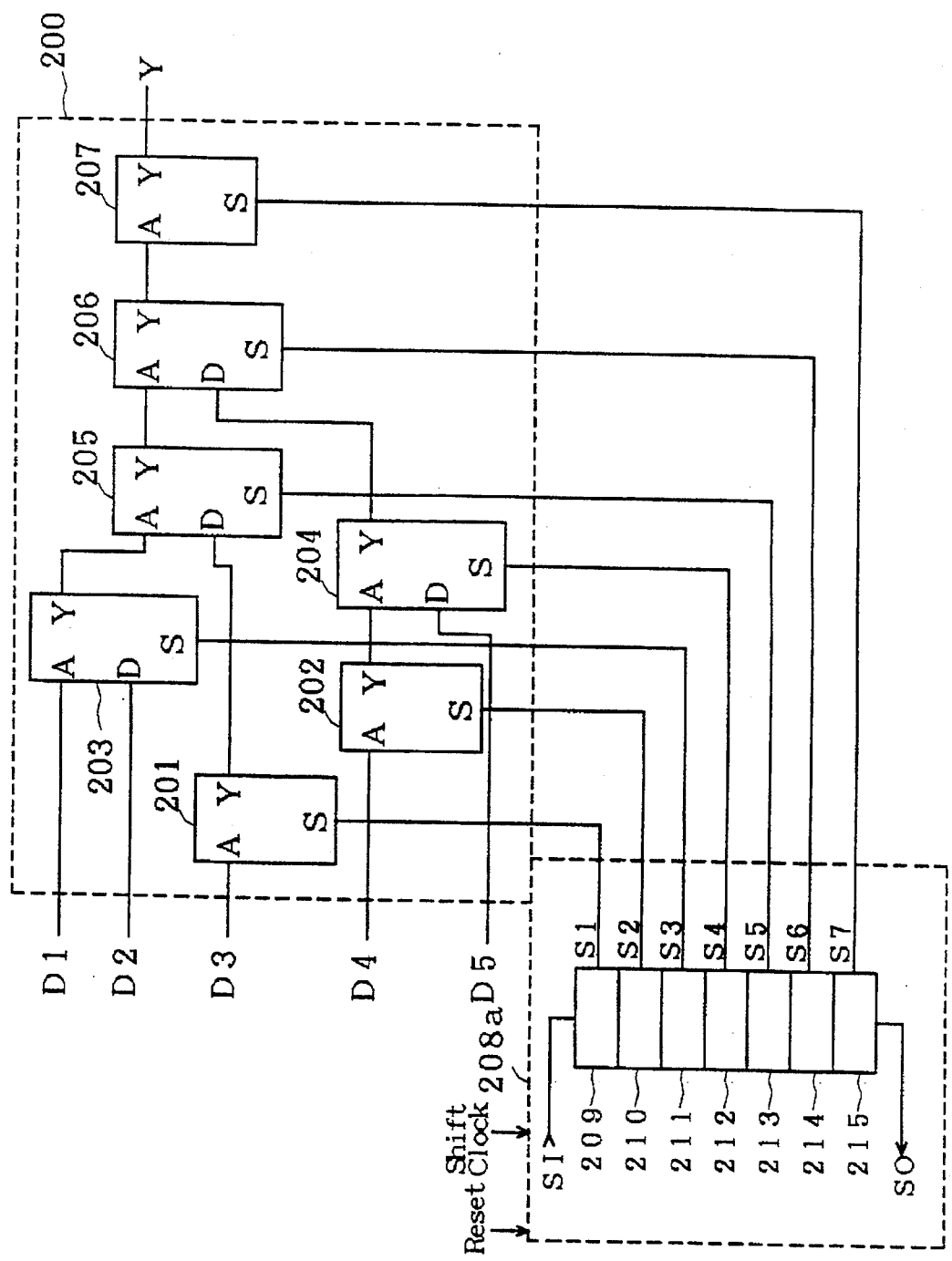
FIGS. 17 to 21 are circuit diagrams of the seventh preferred embodiment according to the present invention.

FIG. 17 is a circuit diagram of a semiconductor integrated circuit 200 designed using programmable logical blocks 201 to 207 selected from the programmable logical blocks 30 and 31. The programmable logical block 31 is selected as the programmable logical blocks 201, 202, 207, and the programmable logical block 30 is selected as the programmable logical blocks 203 to 206.

A block 208a is a control block for controlling the function selection of the programmable logical blocks 201 to 207 and includes program holding registers 209 to 215. Outputs S1 to S7 of the program holding registers 209 to 215 are applied to the terminals S of the programmable logical blocks 201 to 207, respectively, to select the functions of the blocks.

The program holding registers 209 to 215 are serially connected form a shift register. To the shift register are applied a signal ShiftClock for shifting and transmitting a desired program from a serial input terminal SI to a serial output terminal SO and a signal Reset for resetting all data held by the program holding registers 209 to 215 to "0".

Logic design is made by the function achieved at reset time (achieved by S="0") before the fabrication of the semiconductor integrated circuit 200. When a logic change is required after the fabrication, a program for achieving the logic change is transmitted to the program holding registers and the value is held therein.

Figure 18:
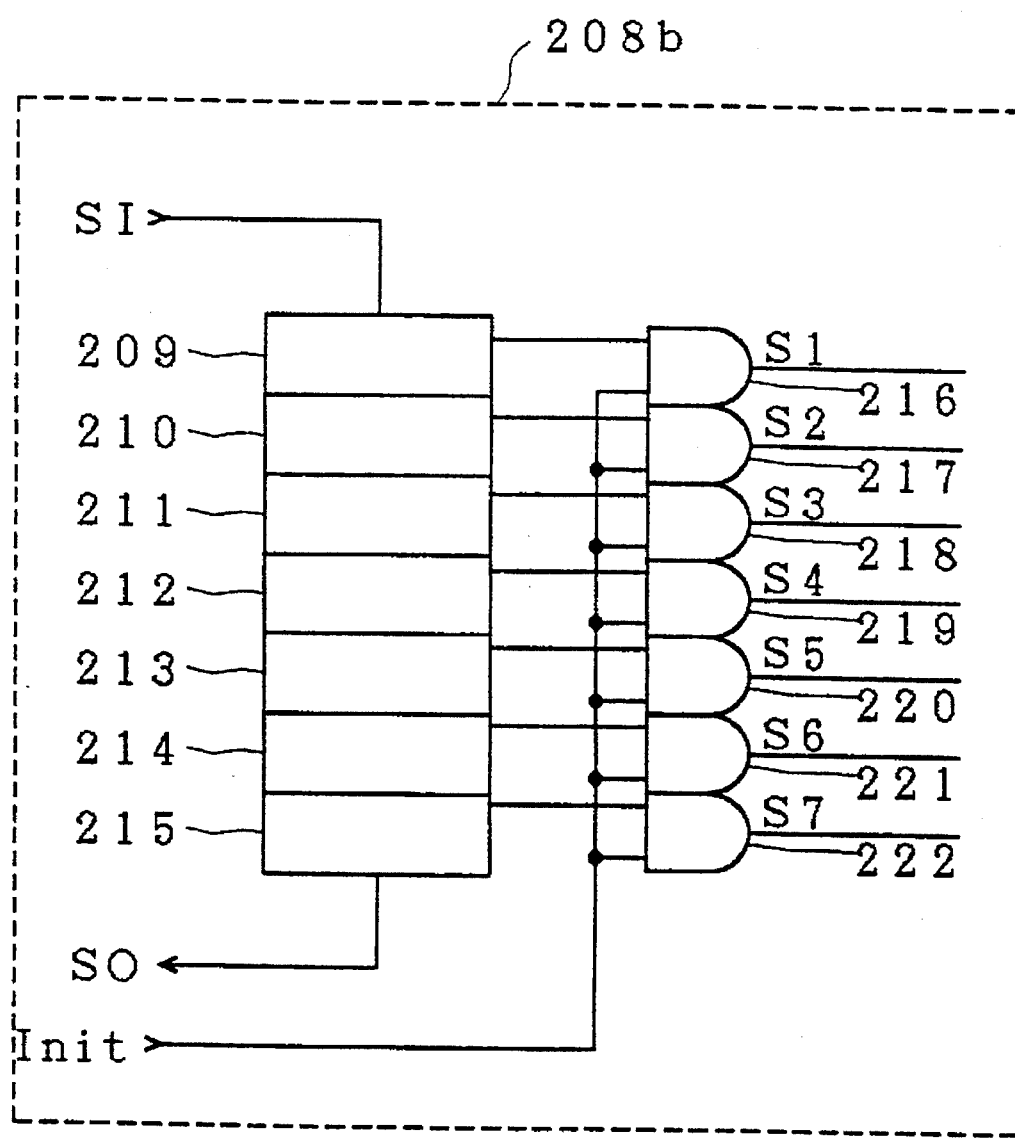

The control block for controlling the function selection of the programmable logical blocks 201 to 207 may be a block 208b shown in FIG. 18. The block 208b includes AND gates 216 to 222 in addition to the block 208a. A signal Init is applied commonly to first inputs of the AND gates 216 to 222 in place of the signal Reset applied to the program holding registers 209 to 215. Second inputs of the AND gates 216 to 222 receive the outputs S1 to S7 of the program holding registers 209 to 215, respectively.

When the signal Init is "0" in the block 208b, the signal applied to the terminals S of the programmable logical blocks is "0" independently of the data held by the program holding registers 209 to 215. In this case, the functions of the programmable logical blocks 201 to 207 remain unchanged even while program data is being transmitted in the program holding registers 209 to 215.

A change from the function (hereinafter referred to as a "main function") selected when the signal applied to the terminals S of the programmable logical blocks 201 to 207 is "0" to a desired function may be done momentarily by the control of the signal Init. Therefore the functions of the semiconductor integrated circuit to be accomplished may be changed dynamically while it operates.

Figure 19:
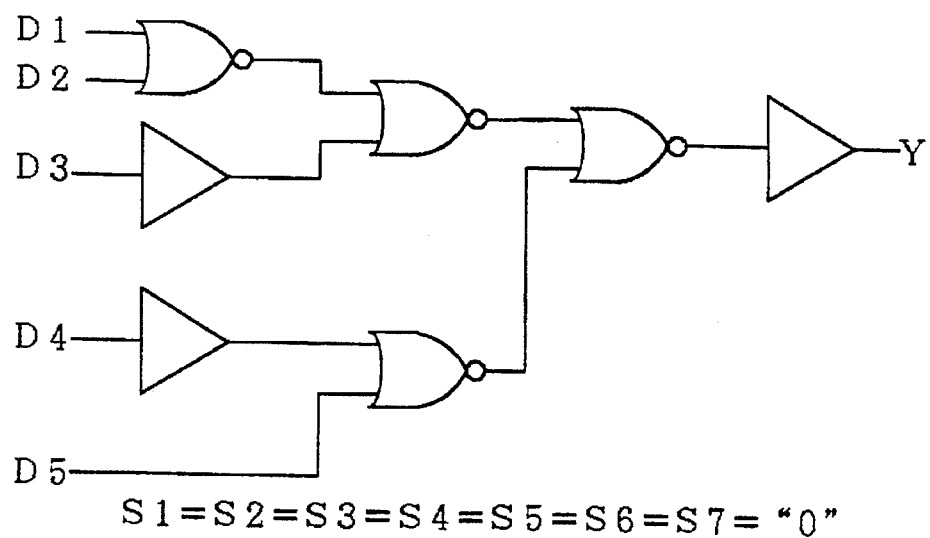
Figure 20:
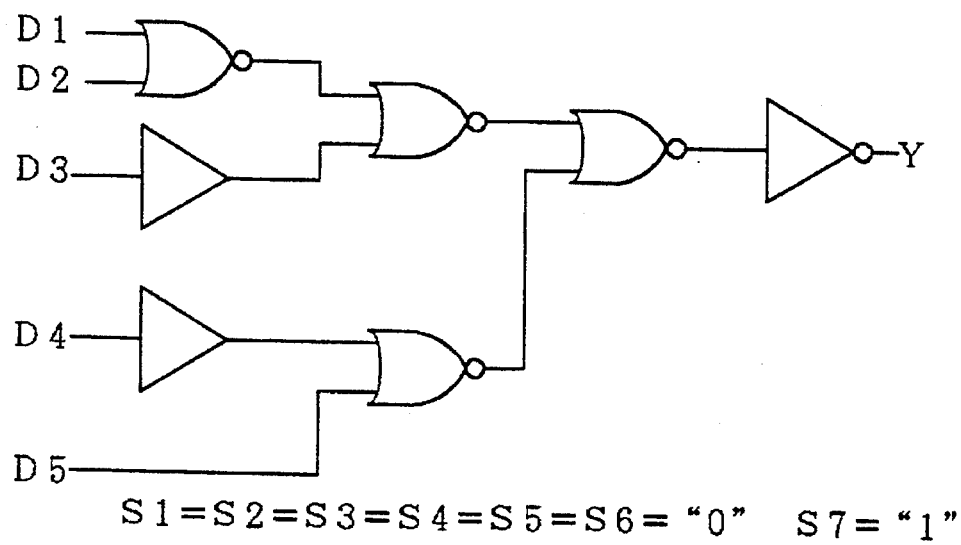
Figure 21:
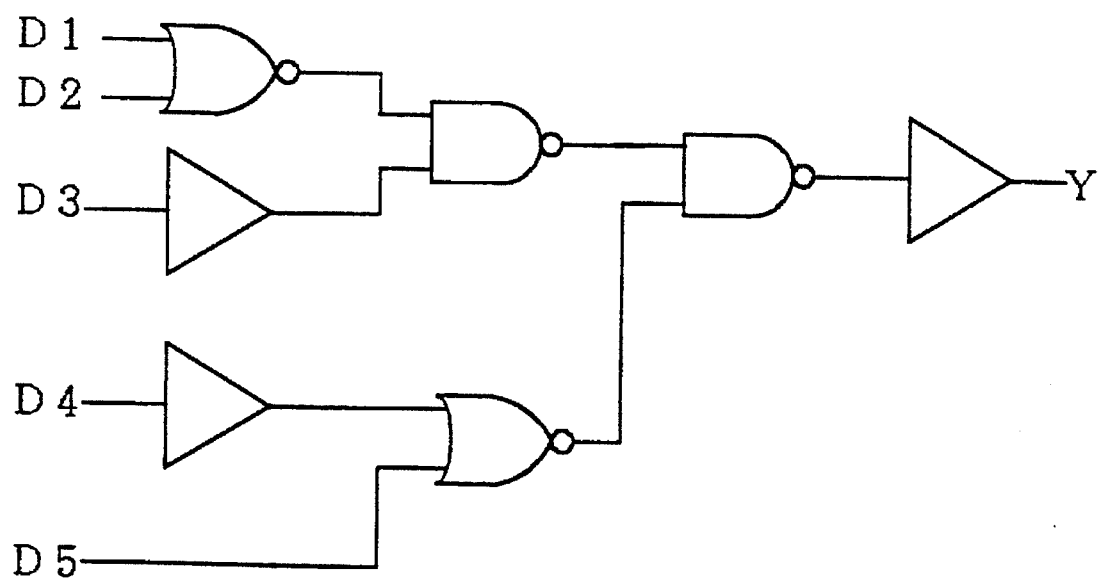

FIGS. 19 to 21 are circuit diagrams showing exemplary functions achievable in the semiconductor integrated circuit 200. FIG. 19 is a diagram wherein all of the outputs S1 to S7 of the program holding registers are "0", that is, the main functions of all programmable logical blocks 201 to 207 are selected. FIG. 20 is a diagram wherein only the main function of the programmable logical block 207 is not selected. FIG. 21 is a diagram wherein only the main functions of the programmable logical blocks 205 and 206 are not selected.

(11) Eighth Preferred Embodiment

Figure 22:
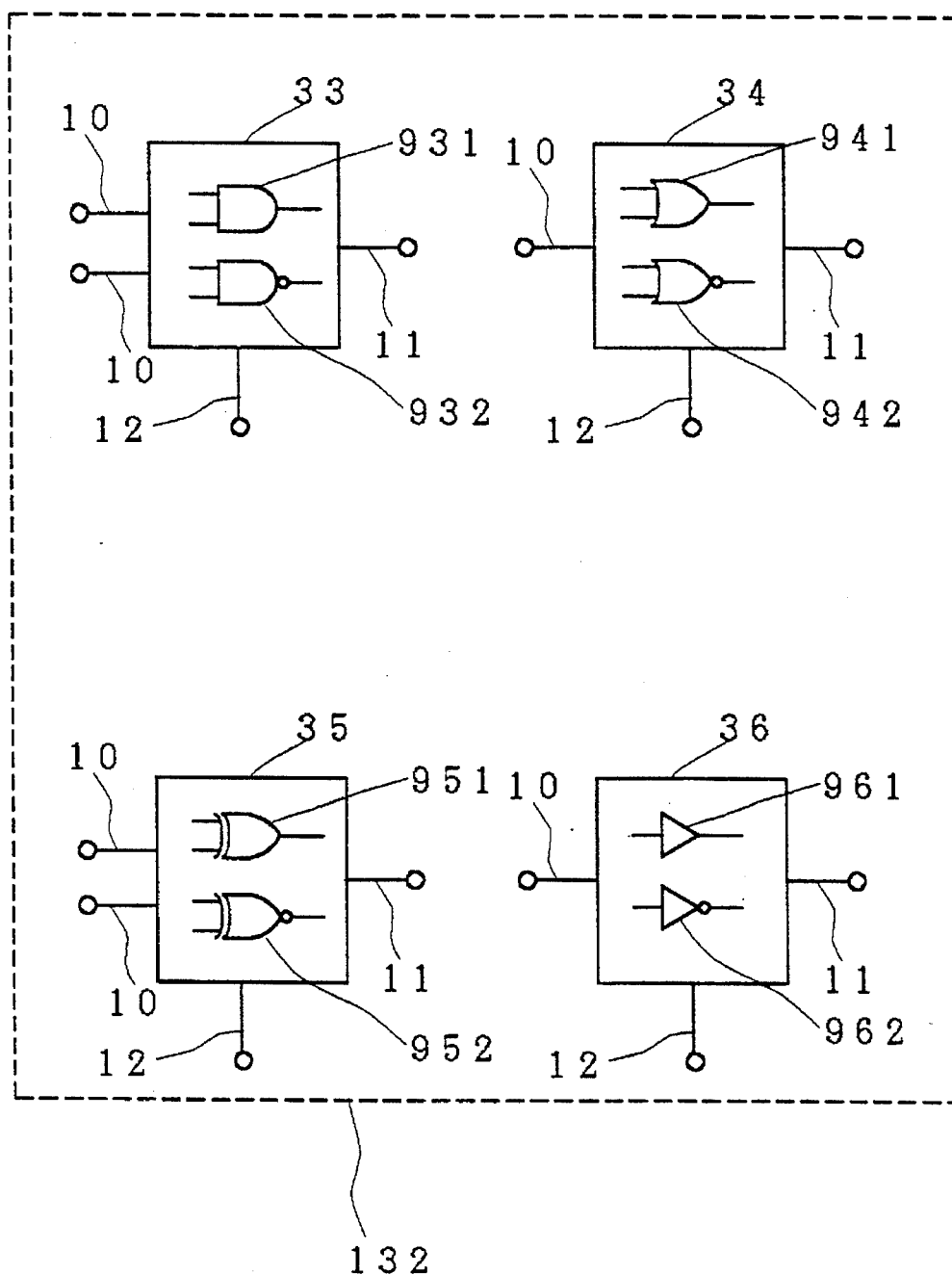
FIG. 22 is a conceptual illustration of an eighth preferred embodiment according to the present invention.

FIG. 22 is a conceptual illustration of a block library 132 for use in a method of designing a semiconductor integrated circuit according to the eighth preferred embodiment of the present invention. The block library 132 includes information of programmable logical blocks 33 to 36. The numbers of input pins 10, output pins 11, function selection signal input pins 12 of the programmable logical blocks 33 to 36 are not necessarily equal. If the respective pins are equal in number, the functions arranged therein are different.

As for example, each of the programmable logical blocks 33 and 35 includes two input pins 10, one output pin 11, and one function selection signal input pin 12. However, the functions arranged in the programmable logical block 33 are an AND gate 931 and an NAND gate 932, whereas the functions arranged in the programmable logical block 35 are an XOR gate 951 and an inverted XOR gate 952. The programmable logical blocks 34 and 36, although having the equal numbers of respective pins, have different logical functions arranged therein: the former has an OR gate 941 and an NOR gate 942, and the latter has a buffer 961 and an inverter 962.

As above described, the classification of the programmable logical blocks according to the number of pins of the programmable logical blocks and the logical functions arranged therein permits the formation of the block library having the repertoires of less redundant programmable logical blocks. Therefore designing the semiconductor integrated circuit using such block library provides the semiconductor integrated circuit which is less redundant and prevents reduction in the degree of integration.

(12) Ninth Preferred Embodiment

Figure 23:
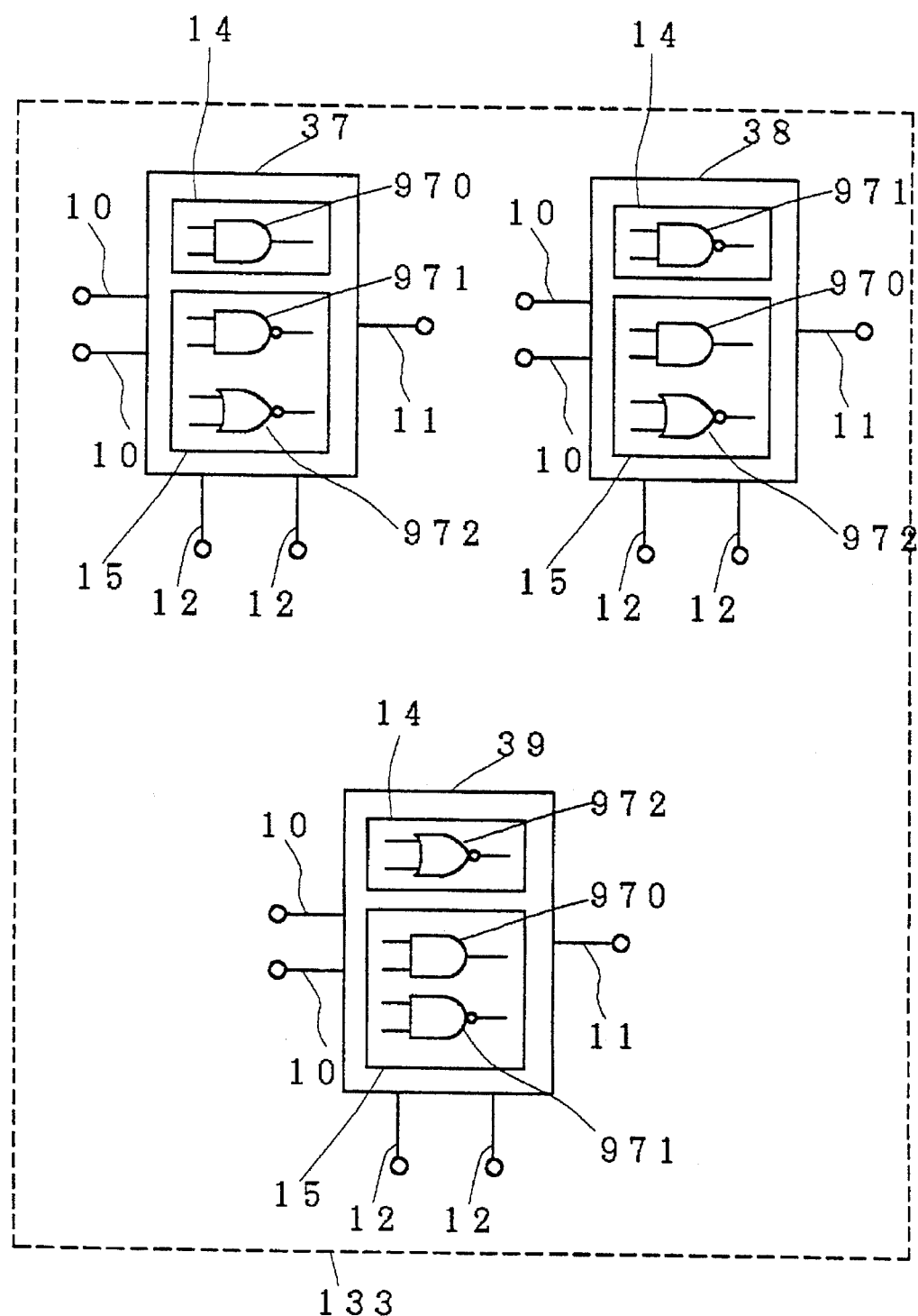
FIG. 23 is a conceptual illustration of a ninth preferred embodiment according to the present invention.

FIG. 23 is a conceptual illustration of a block library 133 for use in a method of designing a semiconductor integrated circuit according to the ninth preferred embodiment of the present invention. The block library 133 includes information of programmable logical blocks 37 to 39. The programmable logical blocks 37 to 39 have the equal numbers of input pins 10, output pins 11, function selection signal input pins 12 and the equal arranged functions.

The functions arranged in the respective programmable logical blocks 37 to 39 are divided into a main function 14 and a subfunction 15 that is other than the main function 14.

As for example, the main function 14 of the programmable logical block 37 includes an AND gate 970, and the subfunction 15 thereof includes an NAND gate 971 and an NOR gate 972. Likewise, the main function 14 of the programmable logical block 38 includes the NAND gate 971, and the subfunction 15 thereof includes the AND gate 970 and the NOR gate 972. The main function 14 of the programmable logical block 39 includes the NOR gate 972, and the subfunction 15 thereof includes the AND gate 970 and the NAND gate 971.

The classification of the programmable logical blocks according to the main function 14 enables a designer to consider only the main function 14 for designing without taking into account the program of the programmable logical blocks to proceed the design in a similar fashion to the conventional gate array.

(13) Tenth Preferred Embodiment

Figure 24:
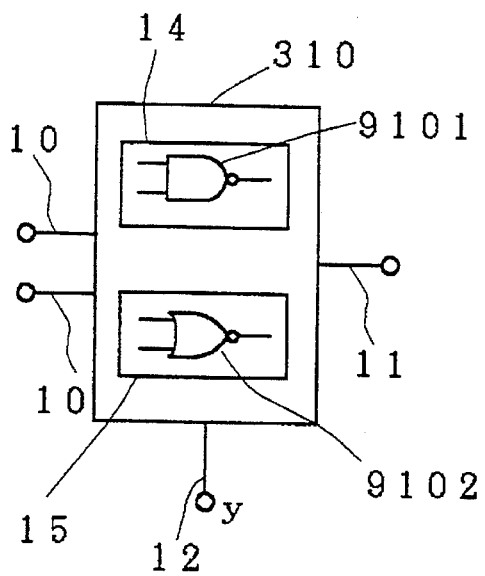
FIGS. 24 and 25 are conceptual illustrations of a tenth preferred embodiment according to the present invention.
Figure 25:
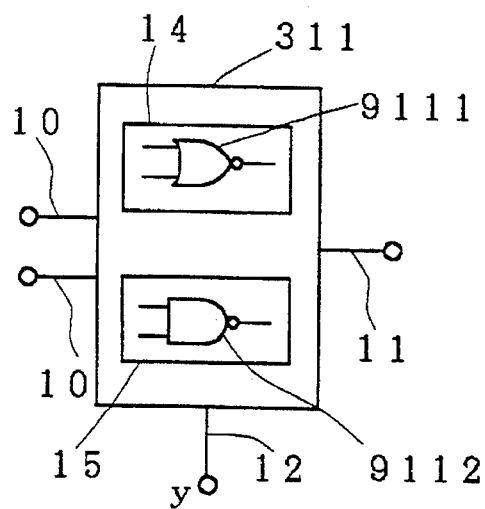

FIGS. 24 and 25 are conceptual illustrations of programmable logical blocks 310 and 311 for use in a method of designing a semiconductor integrated circuit according to a tenth preferred embodiment of the present invention, respectively. The tenth preferred embodiment is similar to the ninth preferred embodiment in that the respective programmable logical blocks 310 and 311 include the main function 14 and the subfunction 15.

The tenth preferred embodiment, however, has only one logical function arranged in the subfunction 15, so that one function selection signal input terminal 12 is sufficient.

Figure 26:
FIG. 26 is a logical table of the tenth preferred embodiment according to the present invention.
Figure 26:
Figure 26:
Figure 26:

FIG. 26 is a logical table showing the logical functions selected in the programmable logical blocks 310 and 311 where a signal y is inputted to the function selection signal input pin 12. The main function 14 is selected where the signal "0" is applied to the function selection signal input pin 12. The main function of the programmable logical blocks may be selected by the single signal y, thereby facilitating program changes.

(14) Eleventh Preferred Embodiment

Figures 27, 28:
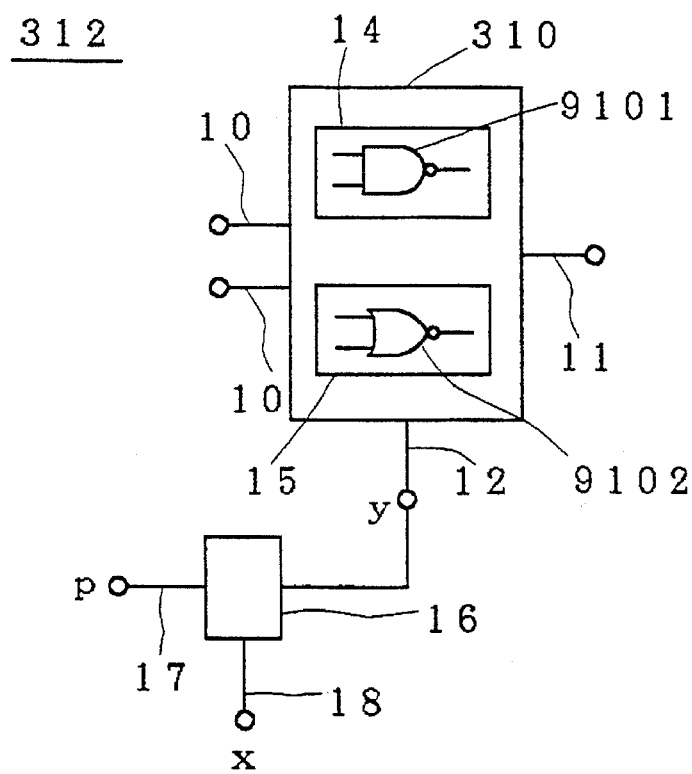
FIG. 27 is a block diagram of an eleventh preferred embodiment according to the present invention.
FIG. 28 is a logical table of the eleventh preferred embodiment according to the present invention.

FIG. 27 is a block diagram of a programmable logical block 312 for use in a method of designing a semiconductor integrated circuit according to an eleventh preferred embodiment of the present invention.

The programmable logical block 312 includes a program storage element 16 in addition to the programmable logical block 310 of FIG. 24.

A predetermined signal p for function selection of the programmable logical block 310 is applied to the program storage element 16 through a program data input pin 17. The program storage element 16 has a reset pin 18 receiving a reset signal x.

FIG. 28 is a logical table showing relationship between the signal x and the signal y. When the reset signal x of "1" is inputted to the reset pin 18, the signal y is "0". The main function 14 (an NAND gate 9101) of the programmable logical block 310 is selected similarly to the tenth preferred embodiment.

When the reset signal x applied to the reset pin 18 is "0", the signal y is equal to the signal p, so that external programs become available.

The main function 14 of the programmable logical blocks 3 may be selected only by the signal x. Program change may be done only by changing the data of the program storage element 16 provided in the programmable logical block to be changed.

(15) Twelfth Preferred Embodiment

Figures 29, 30:
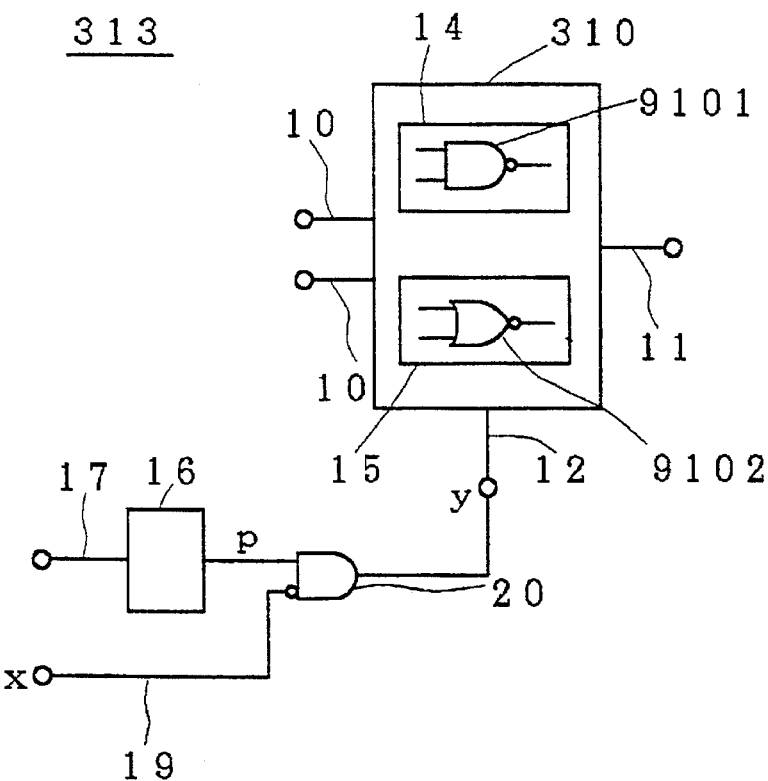
FIG. 29 is a block diagram of a twelfth preferred embodiment according to the present invention.
FIG. 30 is a logical table of the twelfth preferred embodiment according to the present invention.

FIG. 29 is a block diagram of a programmable logical block 313 for use in a method of designing a semiconductor integrated circuit according to a twelfth preferred embodiment of the present invention.

The programmable logical block 313 includes a gate 20 between the program storage element 16 and the selection signal input terminal 12 in the programmable logical block 312 of FIG. 27. The program storage element 16 is not reset.

When the signal x is "1", the gate 20 gives "0" to the selection signal input terminal 12, so that the main function 14 is selected in the programmable logical block 310. On the other hand, when the signal x is "0", the gate 20 gives a signal equal to the signal p, so that the signal p selects the function of the programmable logic block 310. That is, the external programs become available.

FIG. 30 is a logical table showing relationship between the signal x and the signal y. The logical table of FIG. 30 provides the same results as that of FIG. 28. The program change in the same fashion as the eleventh preferred embodiment may be done only by changing the data of the program storage element 16 provided in the programmable logical block to be changed.

Further, the signal x does not directly reset the program storage clement 16 in the twelfth preferred embodiment. The twelfth preferred embodiment is also effective to enable a change of the value of the signal p or the program change during the execution of the programmable logical blocks.

While the invention has been shown and described in detail, the foregoing description is in all aspects illustrative and not restrictive. It is therefore understood that numerous modifications and variations can be devised without departing from the scope of the invention.

We claim:

1. A method of designing a semiconductor integrated circuit, comprising the steps of:
    (a) creating a macro cell library consisting of a plurality of macro cells, wherein each of said plurality of macro cells includes a plurality of predetermined logical functions and a plurality of logical functions in any macro cell in said library is different from a plurality of logical functions in any other cell in said library;
    (b) designing a design architecture for a programmable logic block;
    (c) fabricating said design architecture at a predetermined position of said semiconductor integrated circuit;
    wherein said step of designing comprises the sub-steps of:
    (1) retrieving a first one of said plurality of macro cells from said library and incorporating said first one of said plurality of macro cells into said design architecture;
    (2) retrieving a second one of said plurality of macro cells from said library and incorporating said second one of said plurality of macro cells into said design architecture, wherein said second one of said plurality of macro cells is different than said first one of said plurality of macro cells;
    (3) incorporating an access means for selectively accessing said programmable logic block into said design architecture;
    (4) incorporating a control means for controlling which of said plurality of predetermined logical functions is performed by said programmable logic block into said design architecture; and
    (5) incorporating a fixed logic function block into said design architecture, wherein said fixed logic function block provides a fixed logical function.

2. A method according to claim 1, wherein said macro cell library comprises a macro cell which consists of a plurality of predetermined logical functions for a gate array.

3. A method according to claim 1, wherein said macro cell library comprises a plurality of macro cells which each consists of a plurality of predetermined logical functions for a gate array.

4. A method according to claim 1, wherein said macro cell library comprises a macro cell which comprises a plurality of predetermined logical functions for a gate array.

5. A method according to claim 1, wherein said macro cell library comprises a plurality of macro cells which each comprise a plurality of predetermined logical functions for a gate array.

6. A method according to claim 1, wherein each one of said plurality of predetermined logical functions corresponds to a function performed by a gate array.

7. A method according to claim 1, wherein said first one of said plurality of macro cells has a first number of input pins, said second one of said plurality of macro cells has a second number of input pins, and the first number and second number of input pins are different from one another.

8. A method according to claim 1 wherein said step of designing further comprises incorporating a gate array in said fixed logical function block.

9. A method of designing a semiconductor integrated circuit model and for fabricating a corresponding semiconductor integrated circuit, comprising the steps of:

(a) selecting a programmable logic block model from a library which stores different programmable logic block models;

(b) disposing the programmable logic block model selected in step (a) in a predetermined position of said semiconductor integrated circuit model; and (c) repeating the steps (a) and (b) a predetermined number of times, resulting in different programmable logic block models being disposed in a plurality of different predetermined positions of said semiconductor integrated circuit model;

wherein each one of said different programmable logic block models comprises a model of (1) means for performing a plurality of logical functions, (2) access means for accessing said plurality of logical functions, and (3) control means for controlling which one of said plurality of logical functions is performed by said one programmable logic block;

wherein at least one of said different programmable logic block models disposed in said semiconductor integrated circuit model comprises a model for performing a different logical function from any model for performing logical functions in another one of said different programmable logic block models disposed in said semiconductor integrated circuit model;

(d) disposing a fixed logic function block model at a predetermined location in said semiconductor integrated circuit model, wherein said fixed logic function block model is a model for performing a fixed logical function; and (e) fabricating said semiconductor integrated circuit in accordance with said semiconductor integrated circuit model.

10. A method according to claim 9, and further comprising the step of:

disposing a model of wiring on said semiconductor integrated circuit model for connecting to said plurality of programmable logic block models.

11. A method according to claim 9, wherein said semiconductor integrated circuit model comprises (1) a core region model in which said plurality of programmable logic models are disposed, (2) an input/output buffer region model;

(3) an input/output buffer model for inputting and outputting data between said core region and an exterior of said semiconductor integrated circuit in said input/output buffer region, and said method further comprising the steps of:

disposing said input/output buffer model in said input/output buffer region;

electrically connecting between said input/output buffer model and said plurality of programmable logic model with a model of a wiring line.

12. A method according to claim 11, further comprising the step of:

disposing a model of a wiring line entirely in said core region model.

13. A method according to claim 9, wherein:

each of said programmable logic block models includes model input pins and model output pins, and said library is organized so that said different programmable logic block models of said library are classified according to their number of model input pins and model output pins.

14. A method according to claim 9, wherein:

each of said plurality of programmable logic block models includes model input pins and model output pins, and each of said different programmable logic block models of said library are classified in accordance with (1) a number of their model input pins and model output pins and (2) their logical functions.

15. A method according to claim 9, wherein each of said different programmable logic block models of said library each comprises means for performing a plurality of logical functions including means for performing a main function and at least one subfunction, and each of said different programmable logic block models is classified in said library according to said main function.

16. A method according to claim 15, wherein said at least one subfunction includes a plurality of sub-subfunctions.

17. A method according to claim 15, further comprising the step of selecting said main function with a control signal having a logical value.

18. A method according to claim 17, wherein each of said different programmable logic block models comprises:

a function selecting portion, for selecting which of said plurality of logical functions is to be performed, including a reset terminal for receiving said control signal having the logical value, and a program storage element, coupled to said function selection portion, for storing information for selecting which of said plurality of logical functions is to be performed based upon the logical value of said control signal.

19. A method according to claim 18, wherein the step of selecting said main function with the control signal having the logical value comprises transmitting said control signal to said program storage element wherein one of said plurality of logical functions is selected, and resetting said function selection portion to select said one of said plurality of logical functions.

20. A method according to claim 9 wherein at least one of said different programmable logic block models disposed in said semiconductor integrated circuit model comprises a model having a different number of input pins from any other one of said different programmable logic block models.

21. A method according to claim 9 wherein said model of a fixed function circuit incorporates a model of a gate array.

22. A method according to claim 9 wherein said fixed function circuit incorporates a gate array.

23. A semiconductor integrated circuit, comprising:
a core region;
a first programmable logic block comprising means for performing a first plurality of logical functions; and
a second programmable logic block comprising means for performing a second plurality of logical functions;
a first control means, coupled to said first programmable logic block, for controlling which one of said first plurality of logical functions is performed by said first programmable logic block;
a second control means, coupled to said second programmable logic block, for controlling which one of said second plurality of logical functions is performed by said second programmable logic block;
access via control means, for controlling which one of said first programmable logic block and said second programmable logic block is accessed by an input signal; and
a fixed logic function block consisting of means for performing a fixed logic function.

24. A circuit according to claim 23, further comprising:
an input/output buffer for inputting and outputting data between said core region and an exterior of said semiconductor integrated circuit and said input/output buffer is disposed in an input/output region of said semiconductor integrated circuit.

25. A circuit according to claim 24, further comprising:
wiring lines connecting between said core region and said input/output region.

26. A circuit according to claim 23, further comprising:
a gate array in a gate array region in said core region.

27. A circuit according to claim 23, wherein said means for performing a fixed logic function comprises
a fixed function circuit having a fixed function and located in said core region.

28. A circuit according to claim 27, further comprising:
a gate array in a gate array region in said core region.

29. A circuit according to claim 28, wherein said fixed function circuit comprises a holding block for holding a program of a first programmable logic block;
wherein said gate array region includes a control signal producing block for producing said control signal as a function of said program held by said holding block; and
wherein said holding block and said control signal producing block form a program control block.

30. A circuit according to claim 27, wherein said first programmable logic block and said second programmable logic block are formed in said gate array region.

31. A circuit according to claim 23 wherein said first programmable logic blocks has a different number of input pins from said second programmable logic block.

* * * * *